US010903378B2

(12) United States Patent
Spanier et al.

(10) Patent No.: US 10,903,378 B2
(45) Date of Patent: Jan. 26, 2021

(54) PHOTOVOLTAIC CELLS COMPRISING A LAYER OF CRYSTALLINE NON-CENTROSYMMETRIC LIGHT-ABSORBING MATERIAL AND A PLURALITY OF ELECTRODES TO COLLECT BALLISTIC CARRIERS

(71) Applicants: Drexel University, Philadelphia, PA (US); The Trustees of the University of Pennsylvania, Philadelphia, PA (US)

(72) Inventors: Jonathan E. Spanier, Bala Cynwyd, PA (US); Vladimir M. Fridkin, Moscow (RU); Alessia Polemi, Philadelphia, PA (US); Andrew M. Rappe, Penn Valley, PA (US)

(73) Assignees: Drexel University, Philadelphia, PA (US); The Trustees of the University of Pennsylvania, Philadelphia, PA (US)

( * ) Notice: Subject to any disclaimer, the term of this patent is extended or adjusted under 35 U.S.C. 154(b) by 33 days.

(21) Appl. No.: 16/048,929

(22) Filed: Jul. 30, 2018

(65) Prior Publication Data
US 2019/0058068 A1    Feb. 21, 2019

Related U.S. Application Data

(60) Provisional application No. 62/539,606, filed on Aug. 1, 2017.

(51) Int. Cl.
*H01L 31/02*    (2006.01)
*H01L 31/032*    (2006.01)
(Continued)

(52) U.S. Cl.
CPC .......... *H01L 31/032* (2013.01); *H01G 9/20* (2013.01); *H01L 31/022425* (2013.01);
(Continued)

(58) Field of Classification Search
CPC ................. H01G 9/20; H01G 9/2027; H01L 31/022425; H01L 31/061; H01L 51/445; H01L 31/022466; H01L 31/032
(Continued)

(56) References Cited

U.S. PATENT DOCUMENTS 8,629,347 B2 *    1/2014    Kobayashi .......... H01L 31/0352
                                                    136/252

OTHER PUBLICATIONS

Fridkin, et al., Photoconductivity in certain ferroelectrics, Ferroelectrics 8, 433 (1974).
(Continued)

*Primary Examiner* — Que Tan Le
(74) *Attorney, Agent, or Firm* — BakerHostetler

(57) ABSTRACT

The present invention is directed to photovoltaic and photogalvanic devices and methods of generating electrical energy and power or detecting light therefrom, based on a novel nano-enhanced bulk photovoltaic effect using non-centrosymmetric crystals, including ferroelectric and piezoelectric materials, where the non-centrosymmetry is the equilibrium state or it is static or dynamically induced. In certain embodiments, the device comprises a layer of non-centrosymmetric crystalline materials, and a plurality of electrodes disposed in an array upon or penetrating into at least one surface of the crystalline material, the electrodes being optimally spaced to capture the ballistic carriers generated upon irradiation of the crystalline material.

41 Claims, 7 Drawing Sheets

(51) Int. Cl.
*H01L 31/0224* (2006.01)
*H01L 31/061* (2012.01)
*H01L 51/44* (2006.01)
*H01G 9/20* (2006.01)
*H01L 51/42* (2006.01)

(52) U.S. Cl.
CPC .... *H01L 31/022466* (2013.01); *H01L 31/061* (2013.01); *H01L 51/445* (2013.01); *H01G 9/2027* (2013.01); *H01L 51/4253* (2013.01)

(58) Field of Classification Search
USPC .............................. 250/214.1, 214 R, 203.4
See application file for complete search history.

(56) References Cited

OTHER PUBLICATIONS

Fridkin, Parity Nonconservation and Bulk Photovoltaic Effect in a Crystal Without Symmetry Center, Ultrasonics, Ferroelectrics, and Frequency Control, IEEE Transactions on 60, 1551 (2013).
Koch et al., "Anomalous photovoltage in BaTiO3", Ferroelectrics, 1976, 13, 305-307F.
Malinovsky, "Photoelectric effects in ferroelectrics with high-mobile nonequilibrium electrons", Ferroelectrics, 1982, 43, 125.
V. M. Fridkin, Photoferroelectrics, Kristall and Technik, 15, 802 (1980). (One page of Machine translation and One page of Orginal document).
Wemple, Dielectric and optical properties of melt-grown BaTiO3, J. Phys. Chem. Solids 29, 1709 (1968).

\* cited by examiner

… (1)

PHOTOVOLTAIC CELLS COMPRISING A LAYER OF CRYSTALLINE NON-CENTROSYMMETRIC LIGHT-ABSORBING MATERIAL AND A PLURALITY OF ELECTRODES TO COLLECT BALLISTIC CARRIERS

CROSS REFERENCE TO RELATED APPLICATIONS

This application claims priority to U.S. Patent Application No. 62/539,606, filed Aug. 1, 2017, the contents of which are incorporated by reference in their entirety for all purposes.

GOVERNMENT RIGHTS

This invention was made with government support under grant number W911NF-14-1-0500 awarded by the United States Army Research Office and grant DMR 1124696 awarded by the National Science Foundation. The government has certain rights in the invention.

TECHNICAL FIELD

The present invention is directed to novel materials and designs for photovoltaic cells and photogalvanic devices.

BACKGROUND

A solar module operates to convert energy from solar radiation into electricity, which is delivered to an external load to perform useful work. A solar module typically includes a set of photovoltaic ("PV") cells, which can be connected in parallel, in series, or a combination thereof. The most common type of PV cell is a p-n junction device based on crystalline silicon, but other types of PV cells can be based on amorphous silicon, polycrystalline silicon, germanium, organic materials, and Group III-V semiconductor materials, such as gallium arsenide, Group II-VI materials such as cadmium telluride, semiconductor alloys such as copper indium gallium selenide, and hybrid inorganic-organic trihalide perovskites.

Practical photovoltaic solar energy conversion relies on strong absorption across the visible solar spectrum and on effective exciton separation within a minority carrier diffusion length of barrier-free electrical contacts for efficient carrier collection. Thermalization of photo-excited carriers with energy in excess of the band gap limits power conversion efficiency (PCE), requiring, for single-junction devices, semiconductor absorbers with longer visible-wavelength band gaps close to the peak in the solar spectrum where the Shockley-Queisser (S-Q) efficiency is highest, and with relatively high carrier lifetime-mobility product. These physical barriers limit the energy capture ability of existing solar cell materials.

Solar modules based on each of the semiconductor materials listed above typically suffer limitations on the ability to efficiently convert solar radiation into electrical energy. These limitations included losses or inefficiencies derived from inefficiencies arising from absorption, but significant waste of the solar spectrum in these PV cells. In PV cells based on the semiconductors listed above, photons with energy greater than a bandgap energy of silicon can lead to the generation of photo-excited electron-hole pairs with excess energy. Such excess energy is typically not converted into electrical power but is rather typically lost as heat through hot charge carrier relaxation; i.e., thermalization. Photons with energy less than the bandgap energy are not absorbed significantly and do not contribute much to the conversion of electrical power. However, in conjunction with thermalization losses, photons with energy greater than the bandgap energy of silicon are absorbed, but their contribution to conversion into electrical power is reduced by their lower kinetic energy due to thermalization, also limiting their collection at electrical contacts. As a result, only the portion of the incident solar spectrum that is involves photons in excess of the bandgap energy of a semiconductor can be converted into useful electrical power. However, the power conversion of photon energies greater than the band gap is limited by this thermalization losses.

Photodiode-based detectors and imagers permit detection of light via optically-induced creation of current. The most sensitive photodetectors are typically operated under reverse voltage bias, where appreciable currents resulting from incident photons arise due to well-known impact ionization of carriers under formation of very high built-in electric field, leading to carrier multiplication, i.e., avalanche. Avalanche processes in solid state semiconductor photodetectors are well-known to occur only under finite (non-zero) bias voltage, permitting the high electric field magnitude. In practice, quantum yields in excess of unity are often associated with an avalanche process, but avalanche processes in conventional semiconductor solid state devices are not realized never under short-circuit current conditions because there is no externally applied voltage that permits formation of the large field that induces the breakdown, or avalanche. Therefore, for high-sensitivity current-based detection or imaging of light, bias voltage is always required.

The present invention is directed to addressing at least some of these shortcomings.

SUMMARY

Herein is described photovoltaic devices and methods of generating electrical energy and power therefrom, based on a novel nano-enhanced bulk photovoltaic effect using non-centrosymmetric crystals, including ferroelectric materials, including insulators such as $BaTiO_3$, where the non-centrosymmetry is present in the equilibrium state or it is statically or induced dynamically in the material. In this nano-engineered device, photogeneration and collection of hot, non-equilibrium electrons through the bulk photovoltaic effect and under a locally intense photovoltaic electric field yield an extraordinarily high energy and power conversion efficiency. The solar-cell device, that can be formed in any polar insulator or polar semiconductor, is distinguished by nanostructuring of at least one of the electrodes, whereby nanostructured feature shape, size, arrangement, and spacing, and distribution thereof is in accordance with a photon energy-dependent hemispherical or other-shaped (e.g., distorted hemisphere or half-ellipsoid) volume of hot carrier thermalization and an enhanced photovoltaic field, enabling unprecedentedly large current density in a bulk photovoltaic effect, and resulting energy and power conversion efficiency. Despite absorbing less than 10% of the solar spectrum, the PCE of the bulk photovoltaic effect device formed in $BaTiO_3$ under 1 sun illumination (4.8%) exceeded the S-Q limit (~3%) for a material of this band gap ($E_g$ ca. 3.2 eV), a finding that should not be limited to $BaTiO_3$, but can be obtained using any polar insulator or polar semiconductor possessing a macroscopic polarization. When used as a photogalvanic device, quantum yields, which refer to short-circuit conditions, well in excess of unity are obtained, and are attributed to impact ionization and avalanche of electrons in the large screening field that arises in the nanoscale electrode geometry, in proximity to the thermalization length or volume. Devices harnessing the bulk photovoltaic effect using inherently nanoscaled phenomena and nanostructured electrodes provide a fundamentally new route for practical, high-efficiency photovoltaic solar energy conversion. Such devices also feature efficient conversion of incident light to current, enabling a fundamentally new route for practical, high-efficiency photodetection and imaging in the absence of externally applied bias.

Certain embodiments provide photovoltaic cells, each cell comprising: a layer of crystalline non-centrosymmetric light-absorbing material, the layer having first and second surfaces; and a plurality of electrodes each having a tip disposed in an array, each electrode tip positioned upon or penetrating into at least one of the surfaces of the light-absorbing material; wherein:

each electrode tip is separated from any neighboring electrode tip on or beneath the same at least one surface by a distance in a range of from about 10 nm to about 800 nm;

the light-absorbing material having one or more interband transitions, including a bandgap, $E_c$-$E_v$, in a range of from about 0.5 eV to about 5 eV which, when exposed to at least one wavelength of light in a range of from about 250 nm to about 2500 nm, is capable of generating a current that consists of electrons at least a fraction of which remain ballistic through their collection at the electrodes. In some of these embodiments, the light absorbing material is crystallograpically non-centrosymmetric.

In some of these embodiments, each electrode contacts the at least one surface with an area in a range of from about 100 nm$^2$ to about 1 mm$^2$. The selected value area is expected to or may depend on the thickness of crystal or films. For nanoscaled films, the radius of contact is much less than the thickness of film. In separate embodiments, the electrode arrays can be on either the first or second or both first and second surfaces; for clarity, the first surface is the surface on which, in operation, incoming incident light falls (e.g., front surface);

In other embodiments, the light-absorbing material has one or more interband transitions, including a bandgap, $E_c$-$E_v$, in a range of from about 0.5 eV to about 5 eV which, when exposed to at least one wavelength of light in a range of from about 250 nm to about 2500 nm, is capable of photo-generating a current of non-equilibrium non-thermalized electrons that carry their excess (i.e., above conduction band) energy to the point of their efficient collection at the electrodes, without the usual barrier height impediment due to blocking or non-Ohmic contacts.

The light-absorbing material may be an electric insulator material or a semiconductor. In independent embodiments, the light-absorbing material has a bandgap in a range of from greater than 0 (e.g., 0.5 eV) to about 1 eV, from about 1 eV to about 3 eV, from about 3 eV to about 6 eV, from about 6 eV to about 9 eV, greater than 9 eV, or any combination of two or more of these ranges.

Preferably, the light-absorbing material is a piezoelectric material. In some embodiments, the light-absorbing material a ferroelectric material. In other embodiments, the light-absorbing material exhibits at least one non-zero second or third-rank tensor element, whereby the tensor relates incident electromagnetic field polarization components and intensity with resulting current density. In certain specific embodiments, the material may be a ferroelectric exhibiting at least one non-zero third rank tensor component. In other embodiments, a circular effect involving optically active ferroelectric (e.g., having 1, 2, m, 4, mm2, and other such point groups) may be used, in which case at least one non-zero component of the second rank tensor of the ferroelectric material is an important parameter.

The light-absorbing material may comprise a single crystal or be polycrystalline.

The array of the photovoltaic cell may comprise comprised of two or more sub-arrays, each sub-array tuned to a different wavelength of light, said tuning defined by the spacing of the electrodes within respective sub-array. This spacing may be defined in terms of a parameter 2 times $l_0$, where $l_0$ is defined in terms of:

$$l_0 = ge^{-1}\hbar\omega(\phi\xi^{ex})^{-1},$$

the variables of which are described below.

Other embodiments describe the composition, spacings, and distribution of the electrodes, and the relationship between the electrical connectivity of the electrodes and the light-absorbing material. For example, the spacing of electrodes along one axis may be different than that for a second (or third) axis. All of these parameters are important for optimizing the performance of the cells.

The invention also contemplates methods of making these photovoltaic cells and systems comprising them. The photovoltaic cells exhibit extremely high, exceeding the Shockley-Queisser limit for the given material, and can be operable at photon energies less than the conduction bandgap of the light absorbing material.

BRIEF DESCRIPTION OF THE DRAWINGS

The present application is further understood when read in conjunction with the appended drawings. For the purpose of illustrating the subject matter, there are shown in the drawings exemplary embodiments of the subject matter; however, the presently disclosed subject matter is not limited to the specific methods, devices, and systems disclosed. In addition, the drawings are not necessarily drawn to scale. In the drawings:

FIG. 2A shows time evolution of the short-circuit photocurrent response to monochromatic ($\lambda$=405 nm) illumination showing transient pyroelectric and steady-state photovoltaic components, using a 25 nm-radius probe. FIG. 2B shows the dependence of photovoltaic current with voltage in the BTO crystal under the same wavelength of monochromatic illumination, as compared with that from a $SrTiO_3$ (STO) crystal, each using a 5 μm-radius probe. The dark current in BTO was <1 pA (not shown). FIG. 2C shows the dependence of photovoltaic current in the BTO crystal on monochromatic illumination intensity using a 25 nm-radius tip.

DETAILED DESCRIPTION OF ILLUSTRATIVE EMBODIMENTS

Figure 1A:
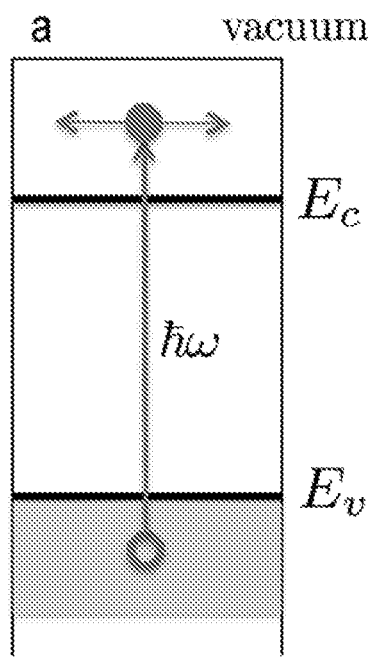
FIGS. 1A and 1B show schematic illustrations of the photo-excitation processes in centrosymmetric (FIG. 1A) and non-centrosymmetric crystals (FIG. 1B).

The present invention is founded on a set of physical principles (described more fully in Example 1) that allows for the use of new materials and design configurations for photovoltaic cells. The use of BPVE in the nanoscale allows for the efficient use of hot carrier management and the harvesting of electricity from solar or other electromagnetic radiation, preferably through the use of ferroelectric piezoelectric materials with electrode spacings based on a spacing parameter $l_0$, defined in terms of a radius of the "hemisphere of thermalization of hot carriers." In the present context, the term "carriers" refers to electrons and/or holes in the crystal lattice.

The present invention may be understood more readily by reference to the following description taken in connection with the accompanying Figures and Examples, all of which form a part of this disclosure. It is to be understood that this invention is not limited to the specific products, methods, conditions or parameters described or shown herein, and that the terminology used herein is for the purpose of describing particular embodiments by way of example only and is not intended to be limiting of any claimed invention. Similarly, unless specifically otherwise stated, any description as to a possible mechanism or mode of action or reason for improvement is meant to be illustrative only, and the invention herein is not to be constrained by the correctness or incorrectness of any such suggested mechanism or mode of action or reason for improvement. Throughout this text, it is recognized that the descriptions refer to compositions and methods of making and using said compositions. That is, where the disclosure describes or claims a feature or embodiment associated with a composition or a method of making or using a composition, it is appreciated that such a description or claim is intended to extend these features or embodiment to embodiments in each of these contexts (i.e., compositions, methods of making, and methods of using).

In certain embodiments, a photovoltaic cell comprises:

a layer of crystalline non-centrosymmetric light-absorbing material, the layer having first and second surfaces; and a plurality of electrodes each having a tip disposed in an array upon or penetrating into at least one of the surfaces of the light-absorbing material; wherein:

each electrode tip is separated from any neighboring electrode tip on or beneath the same at least one surface by a distance in a range of from about 10 nm to about 800 nm, optimally defined by a distance $2 \times l_0$, defined herein;

the light-absorbing material having one or more interband transitions, including a bandgap, $E_c$-$E_v$, in a range of from about 0.5 eV to about 5 eV which, when exposed to at least one wavelength of light in a range of from about 250 nm to about 2500 nm, is capable of generating a current that consists of electrons at least a fraction of which remain ballistic (i.e. do not scatter inelastically) through their collection at the electrodes. It is widely known in the solid state physics, materials science, physical chemistry and electrical engineering communities that one may use one of several techniques to measure carrier mobility, e.g., Hall effect mobility, gating in a transistor geometry, or THz spectroscopy, to quantify mobility. The value of mobility, along with functional variation with temperature, can be taken as evidence of the ballistic (as opposed to diffusive) nature of the transport. In some of these embodiments, the light absorbing material is crystallographically non-centrosymmetric.

While the invention is described in terms of layers, the geometry of the non-centrosymmetric light-absorbing material is not necessarily important, provided that at least one surface of the material can access electromagnetic radiation. Having said this, layers of materials appear to offer the most efficient way of providing large areas upon which this electromagnetic radiation may be received. Where layers are used, these layers may be planar, flat, curved, or undulating. Also, where layers of the light absorbing materials are used, the first and second surfaces may be viewed as sandwiching the layers; e.g., providing top and bottom surfaces, or opposite planes of the layer. In this context, the terms "top" and "bottom" should not be seen as limiting the orientation of the layer or layers, rather as providing a reference for visualizing their position with respect to the layer(s). Additionally, when in use, the cells are operable whether the incident electromagnetic radiation impinges either or both of the defined first and second surfaces, or at any surface of the layer (e.g., including edges perpendicular or otherwise oriented with respect to the first and second surfaces. During operation, the devices may be oriented to accept electromagnetic radiation impinging either perpendicularly or at any angle of incidence, or a gradient of angles of incidences.

In some embodiments, the light-absorbing material has one or more interband transitions, including a bandgap, $E_c$-$E_v$, in a range of from about 0.5 eV to about 5 eV which, when exposed to at least one wavelength of light in a range of from about 250 nm to about 2500 nm, is capable of generating a current of non-equilibrium photo-generated non-thermalized electrons that carry their excess energy to the point of their efficient collection at the electrodes, without the usual barrier height impediment due to blocking or non-Ohmic contacts. In this context, the experimental evidence provided herein of linear current-voltage characteristics under illumination, can be taken as evidence that the transport is not impeded by any barrier. That is, the barrier existed, but the photo-generated carriers were hot enough to overcome the barrier without any manifestation of the barrier.

As used herein, the term "band gap" generally refers to the energy difference (in electron volts) between the top of the valence band and the bottom of the conduction band in insulators and semiconductors. A semiconductor may be characterized as a material with a small but non-zero band gap (typically less than about 3 eV) that behaves as an insulator at absolute zero but allows thermal excitation of electrons into its conduction band at temperatures that are below its melting point. In contrast, a material with a large band gap may be characterized as an insulator. For present purposes, an electric insulator is one defined as having a bandgap greater than about 9 eV. Conductors either have very small band gaps or none, because the valence and conduction bands overlap at ambient temperatures. In independent embodiments, the light absorbing material of the present invention has a bandgaps in a range of from greater than 0 (e.g., 0.1 eV or 0.5 eV) to about 1 eV, from about 1 eV to about 3 eV, from about 3 eV to about 6 eV, from about 6 eV to about 8 eV, greater than 8 eV or greater than 9 eV, or any combination of two or more of these ranges. For example, in certain of these embodiments, the light-absorbing material has a bandgap in a range of 0.5 eV to about 3 eV or in a range of from 0.1 eV to about 8 eV.

In certain embodiments, then, the light-absorbing material is an electric insulator material. The characterization of the insulator may also include the parameters, $\sigma_d$ and $\sigma_{pv}$ (which are described herein in terms of the dark- and photo-conductivity exhibited by the material when exposed to light at a frequency of interest), where $\sigma_{pv} \gg \sigma_d$, for example where $\sigma_{pv}$ is independently 10 times, 50 times, 100 times, 500 times (or more) the value of $\sigma_d$ for that given material.

Ferroelectric materials are class of materials within piezoelectric materials capable of such high piezoelectric coefficients—for example displacive or normal ferroelectrics, relaxor ferroelectrics, incipient ferroelectrics, inorganic ferroelectrics, organic ferroelectrics, and doped ferroelectrics, where an impurity anion or cation introduces an additional symmetry-lowering aspect. Accordingly, such materials are considered within the scope of this invention for this purpose. Such materials are well known, and include perovskite-type materials, such as optionally doped titanates, niobates, and tantalates and optionally doped titanate, niobate, or tantalate oxides. Other such materials include hybrid organic-inorganic or all inorganic trihalide perovskite, e.g. $MAPbI_3$, $MAPbBr_3$, $FASnCl_3$, $CsSnI_3$ or cation and/or anion solid solutions thereof that are in a non-centrosymmetric phase. Still further embodiments include those where the light absorbing materials are described in Examples 4.3 and 4.4 as including $BaTiO_3$, KBNNO (potassium barium nickel niobate), $BiFeO_3$, $LaCoO_3$-doped $Bi_4Ti_3O_{12}$, $KBiFe_2O_5$, cation-ordered $Bi(Fe,Cr)O_3$, non-oxide ferroelectrics, e.g. SbSI, non-centrosymmetric perovskite lead and/or tin trihalides, e.g. $APbX_3$, $APb_xSn_{1-x}X_3$, where A denotes a methylammonium molecule (MA) or similar polar ion or Cs ion, and X denotes a trihalide ion (i.e. I, Br or Cl) or mixture thereof, and $Pb_{1-x}La_xZr_yTi_{1-y}O_3$ (x=0.03, y=0.52) (PLZT). It is well known to those skilled in the art that ferroelectric solid solutions with compositions near the morphotropic phase boundary, e.g., $PbZr_{0.52}Ti_{0.48}O_3$ [PLZT (3/52/48)] or even relaxor ferroelectrics, e.g. solid solutions of lead titanate (PT) with lead zinc niobate (PZN-PT) or lead magnesium niobate (PMN-PT), $Pb_{0.78}Ba_{0.22}Sc_{0.5}Ta_{0.5}O_3$, etc. exhibit the highest piezoelectric coefficients.

Still further, it should be obvious to those skilled in the art that the crystalline non-centrosymmetric materials may arise from crystallographic symmetry breaking, point defects that lower translational symmetry, or other means. Therefore, some embodiments of the present disclosure include those materials including those where the symmetry of a normally centrosymmetric material is broken, even transiently, by application of a large external field, whether electric field, magnetic field or stress, for example by polarization arising from a strain gradient. Separate embodiments, thus provide that the non-centrosymmetry is present in the equilibrium state of a non-centrosymmetric crystalline materials or it is statically or induced dynamically in even a centrosymmetric material.

The light-absorbing material may comprise a single crystal or may be polycrystalline.

In some embodiments, the layer of crystalline non-centrosymmetric light-absorbing material is at least partially transparent or transmissive to an incident light in a range of wavelengths of from about 155 nm to about 12.4 microns, or from about 250 nm to about 2500 nm. Unless otherwise stated, this phrase "at least partially transparent" refers to the ability to transmit at least 30% of incident light through the layer of light absorbing material through the light-absorbing material. In other embodiments, where so stated, this may refer to the ability to transmit at least 20%, 30%, 40%, 50%, 60%, 70%, 80%, or 90% of incident light through the layer at at least one wavelength or range of wavelengths within the total range of from about 250 nm to about 2500 nm. In independent embodiments, this transparency may be defined in terms of the wavelength range, the ability to pass light at any given frequency, or both. Subset ranges of wavelength, for this or any other discussion within this disclosure, include from about 150 nm to about 250 nm, from about 250 nm to about 300 nm, from about 300 nm to about 350 nm, from about 350 nm to about 400 nm, from about 400 nm to about 450 nm, from about 450 nm to about 500 nm, from about 500 nm to about 550 nm, from about 550 nm to about 600 nm, from about 600 nm to about 650 nm, from about 650 nm to about 700 nm, from about 700 nm to about 750 nm, from about 750 nm to about 800 nm, 850 nm to about 900 nm, from about 900 nm to about 950 nm, from about 950 nm to about 1000 nm, from about 1000 nm to about 1200 nm, from about 1200 nm to about 1400 nm, from about 1400 nm to about 1500 nm, from about 1500 nm to about 1600 nm, from about 1600 nm to about 1700 nm, from about 1700 nm to about 1800 nm, from about 1800 nm to about 1900 nm, from about 1900 nm to about 2000 nm, from about 2000 nm to about 2500 nm, or any combination of two or more of these ranges.

This transparency or partial transparency may result from the nature of the light absorbing material, the thickness of the layer, or both.

Within those embodiments wherein the layer is at least partially transparent, additional embodiments include those where the first surface is also at least partially transmissive (using the same parameters as described herein) and the second surface is least one partially reflective over one or more wavelengths of light in a range of from about 250 nm to about 2500 nm. Such an arrangement provides multiple passes of any wavelength of light through the light absorbing layer so as to multiply the effects of any single incident light ray. In such circumstances, the first surface may be described as the incident surface. In such circumstances, the second surface may be referred to as the reflective surface.

The electrode arrays can be applied to either the first or second or both first and second surfaces. Again, the electrodes may be applied to the surface(s) of the layers or penetrate the layers. When applied to the surface, the surface contact area of the electrodes (or projection of the electrode on the surface(s)) is not especially important and may be substantially polygonal or circular. The term "substantially polygonal" refers to any polygon (triangle, quadralateral, pentagon, hexagon, etc.), in which the edges of the shape are either linear or curved or a combination of both. The term "substantially circular" includes oval or having three or more curved lobes. Alternatively, the electrodes may be nanowires, either in a parallel or lattice arrangement. The electrodes may comprise any transparent, semi-transparent or non-transparent conducting material or materials, e.g. one or more layer of metal, transparent conducting oxide, or conducting polymer. For practical considerations, the plurality of electrodes are typically electrically connected to one another, for example, by a common plane or electrical buss, provided this plane or buss is electrically isolated from the absorber material. This may be achieved by an air gap or more practically the plane or buss is electrically isolated from the absorber material by a transparent dielectrice material, for example $SiO_2$, $SiO_x$, PMMA, or $Si_3N_4$ (see Example 4.1). As used herein, the term "plurality of electrodes" refers to two or more electrodes, with separate embodiments including three or more, 5 or more, 10 or more, 50 or more, or 100 or more electrodes up to the capacity of the substrate layer.

The photovoltaic cells of the present invention rely on principles where any contract resistance between the electrodes and the light absorbing material does cause appreciable losses. In certain of these embodiments, the contacts between the light-absorbing material and electrodes are characterized in terms of an electrostatic barrier height between a [ferroelectric] conduction (valence) band in the light absorbing materials and a Fermi level in the electrode, the electrostatic barrier height being in a range between 0 and approximately 2 eV, so as not to impede carrier collection in accordance with the ballistic and non-thermalized nature of the carriers. Again, in this context, the term "carriers" refers to electrons and/or holes in the crystal lattice.

The plurality of electrodes may be applied to either the first or second or both first and second surfaces. When so applied, they may be disposed to be arranged in an array on the first or second or both surfaces. Each electrode may be attached by a simple surface contact to the surface(s) or penetrate into at least one of the surfaces of the light-absorbing material (for example, in a pin arrangement). Where dedicated (attached) to the surface(s), each electrode may contact the at least one surface with an area in a range of from about 100 $nm^2$ to about 1 $mm^2$. In independent embodiments, this contact area may be in a range of from about 100 $nm^2$ to about 200 $nm^2$, from about 200 $nm^2$ to 300 $nm^2$, from about 300 $nm^2$ to about 400 $nm^2$, from about 400 $nm^2$ to about 500 $nm^2$, from about 500 $nm^2$ to 600 $nm^2$, from about 600 $nm^2$ to about 700 $nm^2$, from about 700 $nm^2$ to about 800 $nm^2$, from about 800 $nm^2$ to 900 $nm^2$, from about 900 $nm^2$ to about 1000 $nm^2$, from about 1000 $nm^2$ to about 1500 $nm^2$, from about 1500 $nm^2$ to 2000 $nm^2$, from about 2000 $nm^2$ to about 2500 $nm^2$, from about 2500 $nm^2$ to about 3000 $nm^2$, from about 3000 $nm^2$ to 5000 $nm^2$, from about 5000 $nm^2$ to about 10,000 $nm^2$, from about 10,000 $nm^2$ to about 100,000 $nm^2$, from about 100,000 $nm^2$ to 1 $mm^2$, or any combination of two or more of these ranges. The selected value area is expected to or may depend on the thickness of crystal or films. For nanoscaled films the radius of contact is much less than the thickness of film.

The use of pin (either penetrating into the light absorbing material or providing a small areal contact therewith) electrodes in combination with piezoelectric or ferroelectric materials provides for special enhancements. In such embodiments, a surface (so-called Kanzig) layer is caused by the screening of the spontaneous polarization by the volume charge; the thickness of the Känzig layer in such a crystal is determined by the Debye length $L_d$=50-100 nm. In the tip regime of the electrode, the screening charge is concentrated within this Debye length, $L_d$. When $L_d$ is comparable to $l_0$, a high electric field is created in the same region as the non-thermalized photogenerated carriers, and the photo-excited carriers experience this high field. This can result in impact ionization caused by the non-thermalized (or shifted) high-energy carriers, resulting in $\eta_{EQE}>1$. For planar electrodes the screening field is much less.

As will become increasingly apparent from this disclosure, small electrodes provided at higher surface densities are preferred, since the capture yield of photoelectric energy depends at least as much on the spacing as on the electrode size (see Examples 1 and 4.1-4.2). For a given unit area, minimizing the individual spacings between electrodes (i.e., maximizing the packing density), the best spacing being provided on a dimension of $2 \times l_0$ of the light absorbing material for a given incident wavelength. That is, each electrode area, whether used as a pair or in a higher plurality, may vary from arbitrarily small to large (e.g. 5 um in radius), and still produce N times the photocurrent of one, provided that their separation meets or exceeds $2 \times l_0$ corresponding to the value of $l_0$ for that photon energy, or a weighted average of separations according to the spectral distribution of incident radiation. The specific considerations for these spacings are described elsewhere within this disclosure.

For most contemplated materials and incident wavelength, this value of $2 \times l_0$ is on the order of tens to hundreds of nanometers (equations for their determination provided below). Accordingly, in preferred embodiments, the tip of each electrode is separated from the tip of any neighboring electrode on or beneath the same at least one surface by a distance in a range of from about 10 nm to about 800 nm. This separation distance, between "neighboring electrodes," refers to the distance between the tips of the closest electrodes in the array. Again, this distance is intended to capture a discrete numerical range of $2 \times l_0$, defined in the specification as "tens to hundreds of nm;" but will be further or additionally defined in terms of the radius of thermalization. In separate embodiments, the neighboring electrodes may be separated by a distance in a range of from about 10 nm to about 20 nm, from about 20 nm to about 30 nm, from about 30 nm to about 40 nm, from about 40 nm to about 50 nm, from about 50 nm to about 60 nm, from about 60 nm to about 70 nm, from about 70 nm to about 80 nm, from about 80 nm to about 90 nm, from about 90 nm to about 100 nm, from about 100 nm to about 120 nm, from about 140 nm to about 140 nm, from about 160 nm to about 180 nm, from about 180 nm to about 200 nm, from about 200 nm to about 220 nm, from about 220 nm to about 240 nm, from about 240 nm to about 260 nm, from about 260 nm to about 280 nm, from about 280 nm to about 300 nm, from about 300 nm to about 340 nm, from about 340 nm to about 380 nm, from about 380 nm to about 420 nm, from about 420 nm to about 460 nm, from about 460 nm to about 500 nm, from about 500 nm to about 540 nm, from about 540 nm to about 580 nm, from about 580 nm to about 620 nm, from about 620 nm to about 660 nm, from about 660 nm to about 700 nm, from about 700 nm to about 740 nm, from about 740 nm to about 800 nm, or any combination of two or more of these ranges.

Note that since these spacings relate to this value of $l_0$, for a given material, the concept of "tuning" provides that this spacing can be optimized for a given wavelength of incident of light.

For capture of the energy of sunlight, for example, encompassing a broad spectrum of wavelengths of interest, the packing density (or spacing of electrodes) may be definable in terms of the largest value of $l_0$ over the useful or useable wavelengths. Alternatively, or for monochromatic light, these spacings may be defined by single spacings, according to the "tuning" required for the particular wavelength. For example, a given array of electrodes may comprise two or more sub-arrays, each sub-array tuned to a different wavelength of light, said tuning defined by the spacing of the electrodes within respective sub-array (note that these "sub-arrays" may be considered equivalent to the term "sub-electrodes" used in the Examples). These sub-arrays may be spatially overlapping or non-overlapping, in the latter case referring to the fact that each sub-array is positioned and segregated separately from the any other sub-array.

In some embodiments, the electrode spacing is defined as $2\times l_0$ of at least one wavelength of light in a range of 250 nm to about 2500 nm, where $l_0$ is defined in terms of:

$$l_0 = g e^{-1} \hbar\omega (\phi \xi^{ex})^{-1}$$

for the at least one wavelength of light and the non-centrosymmetric light-absorbing material, where g is the bulk photovoltaic scalar component of the non-centrosymmetric light-absorbing material;

$\hbar\omega$ is the incident photon energy, $\Phi$ is quantum yield, and $\xi^{ex}$ is the photoexcitation asymmetry parameter of the asymmetric light-absorbing material. As described herein, the term "electrode spacing" refers to the closest approach of one electrode edge with that of another (as opposed to center point distances).

In other embodiments, the electrode spacing in each sub-array is tuned to $2\times l_0$ of the wavelength of light to which the sub-array is tuned, where $l_0$ is defined in terms of:

$$l_0 = g e^{-1} \hbar\omega (\phi \xi^{ex})^{-1}$$

for the at least one wavelength of light and the non-centrosymmetric light-absorbing material, where g is the bulk photovoltaic scalar component of the non-centrosymmetric light-absorbing material;

$\hbar\omega$ is the incident photon energy, $\Phi$ is quantum yield, and $\xi^{ex}$ is the photoexcitation asymmetry parameter of the non-centrosymmetric light-absorbing material.

Optimal spacings are those where the distances between the electrodes account for this $2\times l_0$ relationship—at distances greater than $2\times l_0$, the "hot carriers" or ballistic electrons "recognize" each electrode individually, such that the electrical outputs scale with the number of electrodes. At distances less than about $2\times l_0$, this multiplying effect is diminished and efficiency is reduced (see Example 4.1). But at spacings significantly greater than $2\times l_0$, the total output of the cell is diminished for having fewer electrodes per unit area. In preferred embodiments, the (point) electrodes are arranged in a hexagonal surface array (see, e.g., FIGS. 4 and 5).

The electrodes may also comprise nanowires aligned on the at least one surface. In this case, spacing metric may be defined as the distance between aligned nanowires. In those embodiments where the nanowires are arranged to form intersecting lattice arrays, the spacing metric defines the distance between non-intersecting nanowires.

In still other embodiments, the photovoltaic cell further comprises a wavelength-selector, for example a prism or wavelength specific reflector) which, during operation, directs specific wavelengths of light to specific areas of the array. See, e.g., FIG. 5, Example 4.2). This feature provides special benefit when coupled with cells having spatially separated sub-arrays, each sub-array tuned to a specific wavelength. Again, this allows for each sub-array to have optimal packing densities of the electrodes within that array for the given wavelength or wavelengths directed to it.

To this point, the invention has been described in terms of the photovoltaic cells of the present invention. It should also be appreciated that multiple cells can be assembled to form arrays, as part of a larger electrical generating system, which is also considered within the scope of this invention. These photovoltaic cells may also be used in optical or photosensors, where the generation of electricity by incident light triggers an event away from the photovoltaic cell. Such devices are useful in a great variety of electronic devices, circuits, and systems, for example including fiber optic systems, optical scanners, wireless LAN, automatic lighting controls, machine vision systems, electric eyes, optical disk drives, optical memory chips, remote control devices, and responsive display devices, all of which are considered within the scope of the present invention Further embodiments include the methods of generating electricity or triggering a response from these photovoltaic cells, arrays, or assemblies, comprising exposing any of the photovoltaic cells, arrays, or assemblies described herein to a source of incident light and collecting the generated electricity. As described herein, the light may be polychromatic or substantially monochromatic over the wavelength range of from about 250 nm to about 2500 nm. As used herein, the term "substantially monochromatic" defined as light comprising a single or narrow (<30 nm spread) range of wavelengths.

Again, in these methods, the photovoltaic cells may comprise the materials and design considerations of any of the embodiments described herein. In particular, the methods include the use of those devices in which the electrode spacing is tuned to $2\times l_0$ of at least one wavelength of incident light, where $l_0$ is defined in terms of:

$$l_0 = g e^{-1} \hbar\omega (\phi \xi^{ex})^{-1}$$

for the at least one wavelength of light and the non-centrosymmetric light-absorbing material, where g is the bulk photovoltaic scalar component of the non-centrosymmetric light-absorbing material;

$\hbar\omega$ is the incident photon energy, $\Phi$ is quantum yield, and $\xi^{ex}$ is the photoexcitation asymmetry parameter of the non-centrosymmetric light-absorbing material.

Given the physics of the described devices, in some embodiments, electricity may be generated or an even triggered when the incident photon energy, $\hbar\omega$, is greater than the bandgap energy $E_c$-$E_v$ of the light absorbing material, In other embodiments, the incident photon energy, $\hbar\omega$, may be less than the bandgap energy $E_c$-$E_v$ of the light absorbing.

In other embodiments, the methods provide an apparent current-to-power responsivity (A/W) in a range of from about 0.5 mW to about 8 mW for at least one incident photon energy based on a surface of thermalization hemisphere, which is itself a linear function of photon energy. In independent embodiments, this range may be described in terms of from about 0.5 mW to about 1 mW, from about 1 mW to about 2 mW, from about 2 mW to about 4 mW, from about 6 mW to about 6 mW, from about 6 mW to about 8 mW, or any combination of two or more of these ranges. See, e.g., FIG. 3B.

In still other embodiments, the method provides an apparent incident-photon-to collected electron efficiency in a range of from about 1 or greater than 1 to about 2, from about 2 to about 4, from about 4 to about 6, from about 6 to about 8, from about 8 to about 10, from about 10 to about 12, from about 12 to about 14, from about 14 to about 16, from about 16 to about 18, from about 18 to about 20, or any combination of two or more of these ranges for at least one incident photon energy based on a surface of thermalization hemisphere, which is itself a linear function of photon energy. See, e.g., FIG. 3C.

In still other embodiments the methods provide a power conversion efficiency (response to AM1.5 G or other spectrally broad illumination of intensity 1 sun or higher) exceeding of the Shockley-Queisser limit for the said material, determined by its bandgap, based on a combination or spectrally-weighted radii of thermalization hemisphere.

In still other embodiments, the methods provide a power conversion efficiency (defined in terms of a response to AM1.5 G or other spectrally broad illumination of intensity 1 sun or higher) exceeding of the Shockley-Queisser limit for the said material, determined by its bandgap, based on the bulk photovoltaic effect and violation of the principle of detailed balance The methods may also provide an apparent responsivity (current per unit power, e.g. A/W) that is (a) all of the same sign, or (b) changes sign depending on photon energy and the incident optical polarization with respect to crystal polar axis.

Terms

In the present disclosure the singular forms "a," "an," and "the" include the plural reference, and reference to a particular numerical value includes at least that particular value, unless the context clearly indicates otherwise. Thus, for example, a reference to "a material" is a reference to at least one of such materials and equivalents thereof known to those skilled in the art, and so forth.

When a value is expressed as an approximation by use of the descriptor "about," it will be understood that the particular value forms another embodiment. In general, use of the term "about" indicates approximations that can vary depending on the desired properties sought to be obtained by the disclosed subject matter and is to be interpreted in the specific context in which it is used, based on its function. The person skilled in the art will be able to interpret this as a matter of routine. In some cases, the number of significant figures used for a particular value may be one non-limiting method of determining the extent of the word "about." In other cases, the gradations used in a series of values may be used to determine the intended range available to the term "about" for each value. Where present, all ranges are inclusive and combinable. That is, references to values stated in ranges include every value within that range.

It is to be appreciated that certain features of the invention which are, for clarity, described herein in the context of separate embodiments, may also be provided in combination in a single embodiment. That is, unless obviously incompatible or specifically excluded, each individual embodiment is deemed to be combinable with any other embodiment(s) and such a combination is considered to be another embodiment. Conversely, various features of the invention that are, for brevity, described in the context of a single embodiment, may also be provided separately or in any sub-combination. Finally, while an embodiment may be described as part of a series of steps or part of a more general structure, each said step may also be considered an independent embodiment in itself, combinable with others.

The transitional terms "comprising," "consisting essentially of" and "consisting" are intended to connote their generally in accepted meanings in the patent vernacular; that is, (i) "comprising," which is synonymous with "including," "containing," or "characterized by," is inclusive or open-ended and does not exclude additional, unrecited elements or method steps; (ii) "consisting of" excludes any element, step, or ingredient not specified in the claim; and (iii) "consisting essentially of" limits the scope of a claim to the specified materials or steps and those that do not materially affect the basic and novel characteristic(s) of the claimed invention. Embodiments described in terms of the phrase "comprising" (or its equivalents), also provide, as embodiments, those which are independently described in terms of "consisting of" and "consisting essentially of" For those composition embodiments provided in terms of "consisting essentially of," the basic and novel characteristic(s) is the ability to provide the described effect associated with the description as described herein or as explicitly specified.

When a list is presented, unless stated otherwise, it is to be understood that each individual element of that list, and every combination of that list, is a separate embodiment. For example, a list of embodiments presented as "A, B, or C" is to be interpreted as including the embodiments, "A," "B," "C," "A or B," "A or C," "B or C," or "A, B, or C."

Throughout this specification, words are to be afforded their normal meaning, as would be understood by those skilled in the relevant art. However, so as to avoid misunderstanding, the meanings of certain terms will be specifically defined or clarified.

In this regard, the term "photovoltaic cell" carries its normal meaning as a photocell in which an electromotive force is generated by a photovoltaic effect. However, in application, a photovoltaic cell implies, if not specifies, use at finite nonzero bias voltage in order to extract power. That is, no power can be extracted under open circuit or short-circuit conditions in a photovoltaic/solar cell). However, in the present context, the term "photovoltaic cells," as used herein, also connotes those embodiments which are or can be operated under short-circuit current conditions and, through impact ionization and avalanche processes under short-circuit conditions due to internal, locally high screening fields, produces unity or greater quantum yields as described in the examples. In this regard, the devices may also be considered photogalvanic devices. Such a photogalvanic or photodetector device permits impact ionization and avalanche, as described elsewhere herein. Accordingly, the physical attributes provided as describing the photovoltaic cell are also applicable the photogalvanic devices disclosed herein.

One of the many advantages of the photodetector device disclosed herein is the very small dark current and therefore very high range of sensitivity at the low end, as compared with conventional pn junction based devices, and without use of a transistor or similar device for gain, because the present device can be realized in an insulator, as opposed to a semiconductor. Additionally, because the mechanism of photogenerated carrier transport in our devices involves ballistic, rather than diffusive, transport, the response time of our photodetector devices should be one picosecond or faster, rather than the usual nanosecond timescales typical of semiconductor photodiode detectors.

The following listing of Embodiments is intended to complement, rather than displace or supersede, the previous descriptions.

Embodiment 1

A photovoltaic cell comprising:

a layer of crystalline non-centrosymmetric light-absorbing material, the layer having first and second surfaces; and a plurality of electrodes each having a tip disposed in an array upon or penetrating into at least one of the surfaces of the light-absorbing material; wherein each electrode tip is separated from any neighboring electrode tip on or beneath the same at least one surface by a distance in a range of from about 10 nm to about 800 nm, optimally defined by a distance $2 \times l_0$, defined herein; wherein the light-absorbing material having one or more interband transitions, including a bandgap, $E_c - E_v$, in a range of from about 0.1 eV to about 5 eV, preferably from about 0.5 eV to about 5 eV which, when exposed to at least one wavelength of light in a range of from about 12.4 microns to about 155 nm, preferably from about 2500 nm to about 250 nm, is capable of generating a current that consists of electrons at least a fraction of which remain ballistic (i.e. do not scatter inelastically) through their collection at the electrodes. In some of these embodiments, the light absorbing material is crystallograpically non-centrosymmetric. In other embodiments, the non-centrosymmetry is induced, for example, by application of a large external field, whether electric field, magnetic field or stress (e.g. by polarization arising from a strain gradient).

In certain sub-embodiments of this, each electrode contacts the at least one surface with an area in a range of from about 100 nm$^2$ to about 1 mm$^2$. The electrode arrays can be on either the first or second or both first and second surfaces; for clarity, the first surface is the surface on which, in operation, incoming incident light falls (e.g., front surface)].

Again, in certain Aspects of this Embodiment, the photovoltaic cell is used under conditions of a finite nonzero bias voltage in order to extract power. In other Aspects, the photovoltaic cell is or can be operated under short-circuit current conditions, as described elsewhere herein.

Embodiment 2

The photovoltaic cell of Embodiment 1, wherein the light-absorbing material has one or more interband transitions, including a bandgap, $E_c - E_v$, in a range of from about 0.1 eV to about 5 eV, preferably from about 0.5 eV to about 5 eV which, when exposed to at least one wavelength of light in a range of from about 12.4 microns to about 155 nm, preferably from about 2500 nm to about 250 nm, is capable of generating a current of non-equilibrium photo-generated non-thermalized electrons that carry their excess energy to the point of their efficient collection at the electrodes, without the usual barrier height impediment due to blocking or non-Ohmic contacts

Embodiment 3

The photovoltaic cell of Embodiment 1 or 2, wherein the light-absorbing material is an electric insulator material. Characterization of the insulator may include the parameters, $\sigma_d$ and $\sigma_{pv}$ (which are described herein in terms of the dark- and photo-conductivity exhibited by the material when exposed to light at a frequency of interest, specifically where $\sigma_{pv} \gg \sigma_d$, for example 10×, 50×, 100×, 500×, or greater).

Embodiment 4

The photovoltaic cell of Embodiment 1 or 2, wherein the light-absorbing material has a bandgap in a range of 0.5 eV to about 3 eV. In separate, independent Embodiments, the light-absorbing material has a bandgap in a range of from great than 0 (e.g., 0.1 eV or 0.5 eV) to about 1 eV, from about 1 eV to about 3 eV, from about 3 eV to about 6 eV, from about 6 eV to about 8 eV, greater than 8 eV, or any combination of two or more of these ranges.

Embodiment 5

The photovoltaic cell of any one of Embodiments 1 to 4, wherein the light-absorbing material is a piezoelectric material.

Embodiment 6

The photovoltaic cell of any one of Embodiments 1 to 5, wherein the light-absorbing material a ferroelectric material.

Embodiment 7

The photovoltaic cell of any one of Embodiments 1 to 6, wherein the light-absorbing material exhibits at least one non-zero bulk photovoltaic tensor element.

Embodiment 8

The photovoltaic cell of any one of Embodiments 1 to 7, wherein the light-absorbing material is an optionally doped titanate, niobate, or tantalate perovskite-type material.

Embodiment 9

The photovoltaic cell of any one of Embodiments 1 to 8, wherein the light-absorbing material is an optionally doped titanate, niobate, or tantalate oxide perovskite-type material

Embodiment 10

The photovoltaic cell of any one of Embodiments 1 to 9, wherein the light-absorbing material is a single crystal.

Embodiment 11

The photovoltaic cell of any one of Embodiments 1 to 10, wherein the light-absorbing material is polycrystalline.

Embodiment 12

The photovoltaic cell of any one of Embodiments 1 to 11, wherein the layer of crystalline non-centrosymmetric light-absorbing material is at least partially transparent to an incident light in a range of wavelengths of from about 250 nm to about 2500 nm.

Embodiment 13

The photovoltaic cell of any one of Embodiments 1 to 12, wherein the first surface is at least partially transmissive and the second surface is least one partially reflective over one or more wavelengths of light in a range of from about 250 nm to about 2500 nm.

Embodiment 14

The photovoltaic cell of any one of Embodiments 1 to 13, wherein the array is comprised of two or more sub-arrays, each sub-array tuned to a different wavelength of light, said tuning defined by the spacing of the electrodes within respective sub-array.

Embodiment 15

The photovoltaic cell of any one of Embodiments 1 to 14, wherein the electrode spacing is defined as $2 \times l_0$ of at least one wavelength of light in a range of 250 nm to about 2500 nm, where $l_0$ is defined in terms of:

$$l_0 = g e^{-1} \hbar \omega (\phi \xi^{ex})^{-1}$$

for the at least one wavelength of light and the non-centrosymmetric light-absorbing material, where g is the bulk photovoltaic scalar component of the non-centrosymmetric light-absorbing material;

$\hbar \omega$ is the incident photon energy, $\Phi$ is quantum yield, and $\xi^{ex}$ is the photoexcitation asymmetry parameter of the non-centrosymmetric light-absorbing material.

Embodiment 16

The photovoltaic cell of any one of Embodiments 1 to 15, wherein the electrode spacing in each sub-array is tuned to $2 \times l_0$ of the wavelength of light to which the sub-array is tuned, where $l_0$ is defined in terms of:

$$l_0 = g e^{-1} \hbar \omega (\phi \xi^{ex})^{-1},$$

for the at least one wavelength of light and the non-centrosymmetric light-absorbing material, where g is the bulk photovoltaic scalar component of the non-centrosymmetric light-absorbing material;

$\hbar \omega$ is the incident photon energy, $\Phi$ is quantum yield, and $\xi^{ex}$ is the photoexcitation asymmetry parameter of the non-centrosymmetric light-absorbing material.

Embodiment 17

The photovoltaic cell of any one of Embodiments 1 to 16, wherein the surface contact area of the electrodes on the at least one surface are substantially polygonal or circular.

Embodiment 18

The photovoltaic cell of any one of Embodiments 1 to 17, wherein the light absorbing material is a ferroelectric material and the plurality of electrodes comprise pin electrodes, the pin electrode having a tip having a radius of curvature of R, where R is in a range of from about 10 nm to about 5000 nm. In certain of these embodiments, the pin electrode has a Debye length of $L_d$. In certain of these embodiments, $L_d$ is approximately the same magnitude of $l_0$.

Embodiment 19

The photovoltaic cell of any one of Embodiments 1 to 18, wherein the electrodes comprise a transparent, semi-transparent or non-transparent conducting material or materials, e.g. one or more layer of metal, transparent conducting oxide, conducting polymer.

Embodiment 20

The photovoltaic cell of any one of Embodiments 1 to 19, wherein the contacts between the light-absorbing material and electrodes are characterized in terms of an electrostatic barrier height between a [ferroelectric] conduction (valence) band in the light absorbing materials and a Fermi level in the electrode, the electrostatic barrier height being in a range between 0 and approximately 2 eV, so as not to impede carrier collection in accordance with the ballistic and non-thermalized nature of the carriers, where carriers refers to electrons, holes, or both electrons and holes.

Embodiment 21

The photovoltaic cell of any one of Embodiments 1 to 20, wherein the plurality of electrodes are electrically connected to one another.

Embodiment 22

The photovoltaic cell of Embodiments 1 to 21, wherein the electrodes are arranged in a hexagonal surface array.

Embodiment 23

The photovoltaic cell of any one of Embodiments 1 to 21, wherein the electrodes are nanowires aligned on the at least one surface.

Embodiment 24

The photovoltaic cell of any one of Embodiments 1 to 23, further comprising a wavelength-selector (e.g., a prism or wavelength specific reflector) which, during operation, directs specific wavelengths of light to specific areas of the array.

Embodiment 25

A method of generating electricity comprising exposing a photovoltaic cell of any of the preceding claims to a source of incident light and collecting the generated electricity. In certain Aspects of this Embodiment, the wavelength is in one or more wavelength associated with ultraviolet, visible, or infrared radiation, as conventionally understood by the person of skill in the art. Again, in certain Aspects of this Embodiment, the photovoltaic cell is used under conditions of a finite nonzero bias voltage in order to extract power.

Embodiment 26

The method of Embodiment 25, wherein the light is polychromatic over a range of 250 nm to about 2500 nm.

Embodiment 27

The method of Embodiment 25, wherein the light is substantially monochromatic.

Embodiment 28

The method of any one of Embodiments 25 to 27, wherein the electrode spacing is tuned to $2 \times l_0$ of at least one wavelength of incident light, where $l_0$ is defined in terms of:

$$l_0 = g e^{-1} \hbar \omega (\phi \xi^{ex})^{-1}$$

for the at least one wavelength of light and the non-centrosymmetric light-absorbing material, where g is the bulk photovoltaic scalar component of the non-centrosymmetric light-absorbing material;

ℏω is the incident photon energy,
Φ is quantum yield, and
$\xi^{ex}$ is the photoexcitation asymmetry parameter of the non-centrosymmetric light-absorbing material.

Embodiment 29

The method of Embodiment 28, wherein the incident photon energy, ℏω, is greater than the bandgap energy $E_c$-$E_v$.

Embodiment 30

The method of Embodiment 28, wherein the incident photon energy, ℏω, is less than the bandgap energy $E_c$-$E_v$.

Embodiment 31

The method of any one of Embodiments 25 to 30, wherein the method provides an apparent incident-photon-to collected electron efficiency in a range of from 1 or greater than 1 to about 20 for at least one incident photon energy based on a surface of thermalization hemisphere, which is itself a linear function of photon energy.

Embodiment 32

The method of any one of Embodiments 25 to 31, wherein the method provides an apparent current-to-power responsivity (A/W) in a range of about 0.5 mW to about 8 mW for at least one incident photon energy based on a surface of thermalization hemisphere, which is itself a linear function of photon energy Embodiment 33

The method of any one of Embodiments 25 to 32, wherein the method provides a power conversion efficiency (response to AM1.5 G or other spectrally broad illumination of intensity 1 sun or higher) exceeding of the Shockley-Queisser limit for the said material, determined by its bandgap, based on a combination or spectrally-weighted radii of thermalization hemisphere.

Embodiment 34

The method of any one of Embodiments 25 to 33, wherein the method provides a power conversion efficiency (i.e., response to AM1.5 G or other spectrally broad illumination of intensity 1 sun or higher) exceeding of the Shockley-Queisser limit for the said material, determined by its bandgap, based on the bulk photovoltaic effect.

Embodiment 35

The method of any one of Embodiments 25 to 34, wherein the method provides an apparent responsivity (current per unit power, e.g. A/W) that is (a) all of the same sign, or (b) changes sign depending on photon energy and the incident optical polarization with respect to crystal polar axis.

Embodiment 36

A method of detecting at least one wavelength of incident light comprising exposing a photovoltaic cell of any of Embodiments to a source of incident light under conditions wherein the photovoltaic cell is operated under short-circuit current conditions, as described elsewhere herein. In certain Aspects of this Embodiment, the wavelength is in one or more wavelength associated with ultraviolet, visible, or infrared radiation, as conventionally understood by the person of skill in the art. In other Aspects of this Embodiment, the photovoltaic cell operates under the avalanche conditions otherwise described herein.

Embodiment 37

The method of Embodiment 36, wherein the light is polychromatic over a range of 250 nm to about 2500 nm.

Embodiment 38

The method of Embodiment 36, wherein the light is substantially monochromatic.

Embodiment 39

An electricity generating system comprising at least one of the photovoltaic cells of any one of Embodiments 1 to 24.

Embodiment 40

An electric optical or photosensor device comprising at least one of the photovoltaic cells of any one of Embodiments 1 to 24

Embodiment 41

The electric optical or photosensor device of Embodiment 40 comprising a fiber optic system, optical scanner, wireless LAN, automatic lighting control, machine vision system, electric eye, optical disk drive, optical memory chip, remote control device, or responsive display device.

EXAMPLES

The following Examples are provided to illustrate some of the concepts described within this disclosure. While each Example is considered to provide specific individual embodiments of composition, methods of preparation and use, none of the Examples should be considered to limit the more general embodiments described herein.

Example 1. Theoretical Considerations

In classical solid-state photovoltaic (PV) devices photogenerated charges are separated by the field developed at a p-n junction, a dye-sensitizer interface, at a domain boundary, or due to the Dember effect. All of these PV effects have in common the following: an inhomogeneous excitation or spatially-inhomogeneous medium; and the photovoltage in the unit element does not exceed the band gap $E_g$. The bulk photovoltaic effect (BPVE) in non-centrosymmetric crystals is a striking physical phenomenon: photovoltage generated by BPVE can greatly exceed the band gap $E_g$, but the direct conversion of light energy (e.g., solar) to electricity is extremely low. Over the past decade, photovoltaic effects in polar materials have attracted renewed attention.

Also known as the anomalous photovoltaic effect, the BPVE can be observed in crystals which belong to 20 point groups lacking a center of inversion symmetry (ferro- and piezoelectrics); i.e., $C_1$, $C_2$, $C_s$, $D_2$, $C_{2v}$, $C_4$, $S_4$, $D_4$, $C_{4v}$, $D_{2D}$, $C_3$, $D_3$, $C_{3v}$, $C_6$, $C_{3h}$, $D_6$, $C_{6v}$, $E_{3h}$, T, O, and $T_d$. The origin of the BPVE is connected with violation of the Boltzmann principle of detailed balance. Nevertheless Boltzmann himself supposed that this principle could be violated in some cases, and the BPVE in a non-centrosymmetric crystal represents the first experimental evidence of the violation of the principle of detailed balance.

Figure 1B:
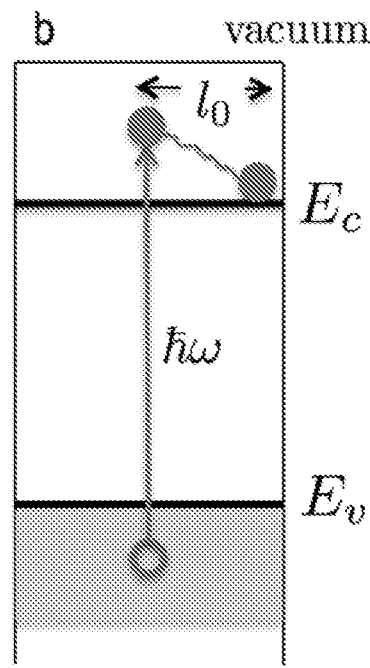
Figure 1C:
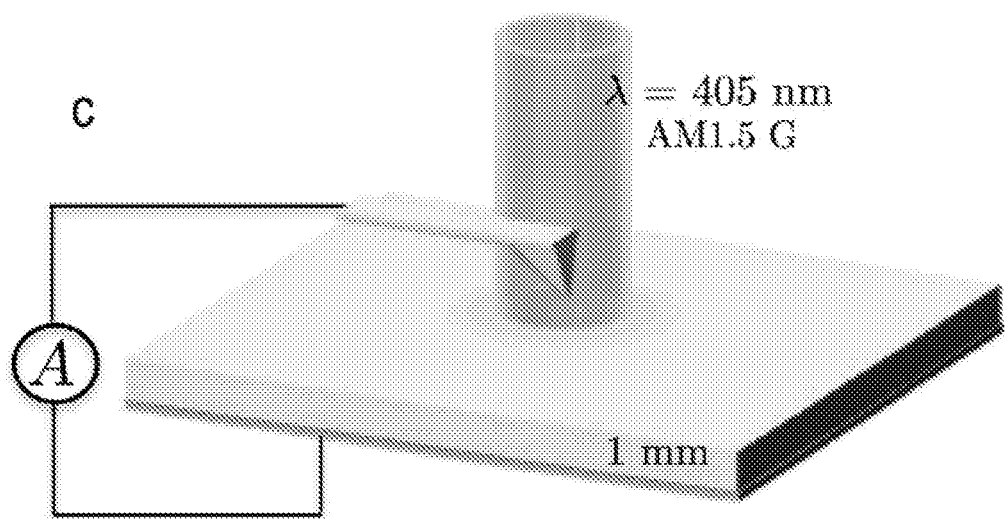
FIG. 1C shows the experimental configuration used.

There are two proposed mechanisms of BPVE: ballistic and shift. The ballistic mechanism is associated with the excitation of non-thermalized (hot) carriers in a crystal and is caused by the asymmetric distribution of their momentum. The internal photo-effect is illustrated in FIG. 1 for (a) centrosymmetric and (b) non-centrosymmetric crystals. The fundamental difference is that the excitation of photoelectrons in the latter provides an asymmetric momentum distribution of non-thermalized carriers in the conduction band. Photo-excited non-thermalized carriers lose their energy and descend to the bottom of the band over free path $l_0$. The alternative, shift mechanism of the BPVE, is quantum-mechanical in nature, obtained by taking into account the non-diagonal elements of the density matrix. The BPVE in this case is caused not by the carrier movement in the band, but by the shift R in real space following the carrier band-band transition. The value of $l_0$ is material-dependent; $l_0$ is estimated to be on the order of tens to hundreds of nm.

If a homogeneous medium of thickness d without a center of symmetry possessing short-circuited electrodes is subjected to a uniform illumination, it leads to the generation of a steady-state current $j_{pv}$ that depends on the intensity and polarization of the light. If the electrodes are disconnected, i.e., in the open-circuit condition, the current $j_{pv}$ generates the photovoltage $$V_{oc} = \frac{j_{pv}d}{\sigma_d + \sigma_{pv}} \qquad (1)$$

with the photovoltaic field $$E_{pv} = j_{pv}/\sigma_{pv} \qquad (2)$$

where $\sigma_d$ and $\sigma_{pv}$ are the dark- and photo-conductivity, respectively, the latter being $$\sigma_{pv} = e I_0 \alpha \phi (\hbar\omega)^{-1} (\mu\tau)_{pv}. \qquad (3)$$

$I_0$ is light intensity, $\alpha$ is the absorption coefficient, $\phi$ is quantum yield, $\hbar\omega$ is the incident photon energy, and $\mu$ and $\tau$, respectively, are the mobility and lifetime of carriers responsible for photoconductivity. The tensor properties of the linear BVPE current are described by $$j_{pv}^i = \alpha g_{ijl} e_j e_l I_0 \qquad (4)$$

where $e_j$ and $e_l$ are the components of the light polarization vector, $g_{ijl}$ is the corresponding third-rank piezoelectric tensor. For a (001)-oriented BTO crystal we can assign $g_{ijk} \equiv g_{31}$. The corresponding scalar relations are:

$$j_{pv} = \alpha g I_0 \qquad (5)$$

$$E_{pv} = \frac{g}{\phi(\mu\tau)_{pv}} \frac{\hbar\omega}{e}. \qquad (6)$$

For $\sigma_{pv} \gg \sigma_d$ the photovoltaic field $E_{pv}$ does not vary with light intensity $I_0$, but $j_{pv}$ scales linearly with $I_0$.

Since it is also the case that $$j_{pv} = e\alpha I_0 (\hbar\omega)^{-1} \phi \xi^{ex} l_0 \qquad (7)$$

where $\xi^{ex}$ ($=\xi^{ex}(k_0)$) is the photoexcitation asymmetry parameter, $$l_0 = g e^{-1} \hbar\omega (\phi \xi^{ex})^{-1} \qquad (8)$$

Thus for bulk BaTiO$_3$ crystal $g_{31} = 3\times10^{-9}$ cm/V, $\xi^{ex} = 10^{-3}$ at $\hbar\omega = 3.06$ eV, and $l_0$ is ca. 90 nm.

The power conversion efficiency $\eta$, which can be obtained from (1-6), is given by $\eta = g E_{pv}$. For a bulk BaTiO$_3$ crystal, $E_{pv}$ is ca. 100-200 V/cm and $\eta$ is ca $10^{-6}$-$10^{-7}$. In (3) and (6) $\mu$ and $\tau$ are associated with thermalized non-equilibrium carriers, which do not contribute to the BPVE. However, if d is ca. $l_0$, $E_{pv}$ can be increased significantly because all photoexcited carriers contribute to the BPVE, significantly raising $\eta$. This idea has been realized in Pt/BaTiO$_3$/Pt heterostructures with BaTiO$_3$ (BTO) thickness 20 and 40 nm and with planar electrodes. The conversion quantum efficiency of BaTiO$_3$ at the nanoscale $\eta$ is ca. $10^{-2}$, an increase of 5 orders of magnitude in comparison with bulk crystals.

A $10^7$-fold enhancement in apparent external quantum efficiency $\eta_{EQE}$ (to ca. 1) in BiFeO$_3$ using an electrically conductive atomic force microscopy (AFM) probe has been reported, but no explanation of its origin or mechanism was provided. It had been assumed that efficient solar PV energy conversion required a semiconductor with strong optical absorption, carrier separation involving an interface, reasonable $\mu\tau$ product, and a sizable length over which photoexcited carriers diffuse to reach the contact. It is here demonstrated, using the BPVE in a nanoscale geometry, that extraordinarily high quantum efficiencies and practical power conversion efficiency can be attained in a polar insulator (BaTiO$_3$). Significantly, the present work describes how hot carriers are photogenerated, travel ballistically in a locally intense electric field, and are collected from an entire volume of thermalization. See FIG. 1.

Example 2. Materials and Methods

Methods.

BaTiO$_3$ (001) and SrTiO$_3$ (100) crystals (MTI, CA) 1.0 mm and 0.5 mm in thickness, respectively, and each 5×5 mm$^2$ in area were used. Silver paste was introduced to one face as the bottom contact, and each crystal was poled at 300 K at >750V for 100 s. following collection of ferroelectric hysteresis loops (also at 300 K) in atmosphere using a Radiant LC ferroelectric tester interfaced with a high-voltage source and amplifier. Following poling, the crystal was placed in an optically-accessible vacuum probe station (Lakeshore TTP4). Current-voltage data were collected under dark conditions and under monochromatic ($\lambda$=405 nm) illumination over an elliptical area of ca. 8 mm$^2$ with selected intensities ranging from 100-470 mW/cm$^2$, under tunable monochromatic illumination (Horiba PowerArc 75 W Xe lamp and 0.2 m f/4 monochromator equipped with switchable gratings) from 200<$\lambda$<600 nm producing a 20 nm spectral bandwidth, with light routed to the sample through a quartz fiber and optical collimator producing a 6.4 mm-diameter spot, and under 1 sun AM1.5 G illumination (100 mW/cm$^2$, Newport LCS-100), all at 300 K. Measured photocurrents were normalized to reference intensities at each wavelength were measured using a calibrated optical power meter (Gentec Maestro). Measurements were conducted both under vacuum ($10^{-6}$ torr) and under atmosphere. Electrical contact to the top of the crystal was attained by using probes of several 297 different radii, specifically 5 µm, W and by an atomic force microscopy probe (Nanoworld Pointprobe, <25 nm radius, including an electrically conductive layer of PtIr$_5$) and alternately, ca. 40 nm-radius, Pt coated tips (MikroMasch DPE-XSC11) mounted onto the end of the tungsten probe using Ag paste. Positive voltage refers to positive voltage applied to the tip with respect to the bottom electrode. Positive bias was applied to the top-contact-tip while it was held above the surface and not in contact. The current was then monitored while the tip was lowered slowly until a steady current was observed. Current-voltage sweeps were collected using a Keithley SCS-4200 starting from zero bias, proceeding to positive bias to the maximum voltage of ca. +10V, returning to zero and proceeding without interruption to negative bias voltage, and when returning to zero. Several traces were collected successively in the same location and also in different locations on the crystal, and using multiple tips of the same and different type. Several AFM tips were imaged using high-resolution scanning electron microscopy (Zeiss VP50) to confirm that the tip radius did not become significantly blunted or fractured after probing. An apparent external quantum efficiency ($\eta_{EQE}$) was calculated by dividing $J_{sc}e^{-1}$ [electrons/sec/area] by the number of photons incident per sec per area, i.e., $I_0(1.6\times10^{-19}/\hbar\omega)$ [photons/sec/area]. The apparent incident photon-to-collected electron efficiency (IPCE) is presented as the value of $\eta_{EQE}$ for each photon energy measured.

Example 3. Experimental Results

Conductive AFM tips of radii 25 nm and 40 nm, and alternately, a 5 μm-radius conductive probe were each placed in contact with the (100) surface of a monodomain BaTiO$_3$(001) (BTO) crystal possessing a bottom planar electrode, and illuminated using a λ=405 nm laser (FIG. 1C) with a spot area of 2×4 mm$^2$ and spot area-averaged intensities 100 mW/cm$^2$≤$I_0$≤470 mW and, alternately, under 1 sun (100 mW/cm$^2$), AM1.5 G illumination, and under a tunable monochromatic light source. Since $\alpha_{BTO}$ is ca. 5-10 cm$^{-1}$ at $\hbar\omega$=3.06 eV [20], most of the light is absorbed in the crystal.

Figure 2A:
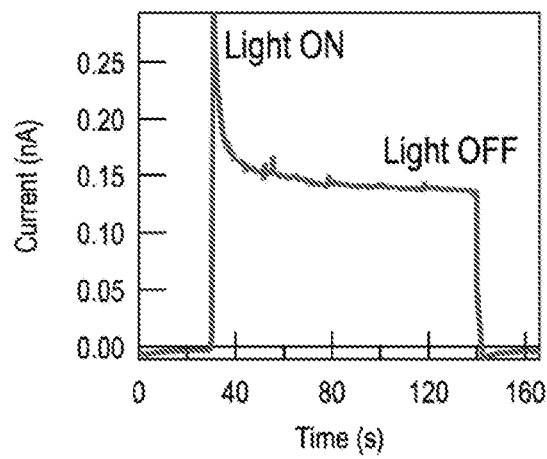
FIGS. 2A-C shows bulk photovoltaic and photocurrent responses in the nanoscale in bulk single-domain ferroelectrically-poled ferroelectric $BaTiO_3$ (BTO) collected along the same, poled direction, i.e. (001).
Figure 2B:
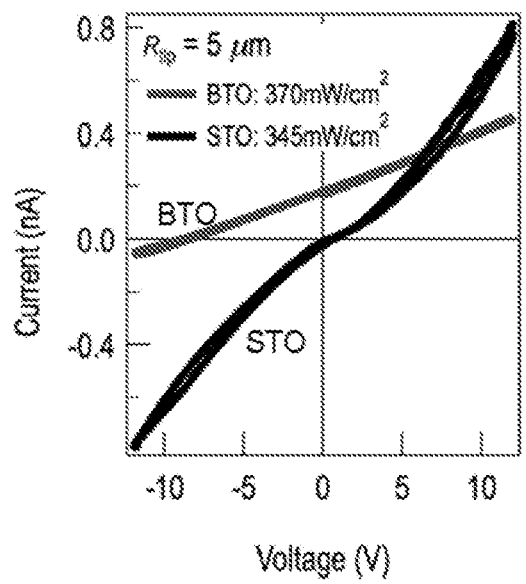
Figure 2C:
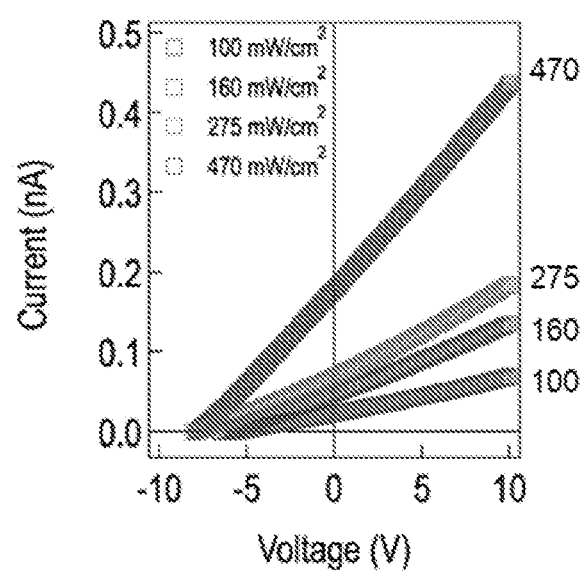

Time evolution of the short-circuit current $I_{sc}$ in BTO using the 25 nm-radius tip is shown in FIG. 2A: pyroelectric response upon illumination was followed by steady state photovoltaic current. Using the large-radius (5 μm) probe, the response in BTO (FIG. 2B) shows a photovoltage $V_{oc}$ (ca. −8V) that far exceeded the band gap of BTO and $I_{sc}$ ca. 0.2 nA. In contrast, response collected from the isostructural, but paraelectric SrTiO$_3$ ($E_{g.STO}$ ca. 3.2 eV) exhibits no detectable $I_{sc}$ or $V_{oc}$ (FIG. 2B). Observed values of Voc in BTO using the 5 μm-, 25 nm-, and 40 nm-radii tips are the same. $V_{oc}$ was nearly independent of I0 (FIG. 2C), in accordance with Eq. (6).

The electrode area (i.e., the contact area of the tip) is normally required for calculating current density and estimating conversion efficiency. However, $I_{sc}$ for the 5 μm, 25 nm- and 40 nm-radius probe electrodes under comparable illumination intensity, was remarkably similar (ca. 0.15-0.2 nA, FIG. 2B,C), despite a more than three orders of magnitude difference in probe radius. It was also found that after lowering the probes enough to observe the onset of a stable current reading, $I_{sc}$ did not vary with loading and was reproducible after repeatedly raising and lowering the probe, providing further confirmation that the current was independent of contact area in these experiments. Thus the actual value of current density $j_{pv}$ and the energy conversion efficiency η could not be obtained from the actual or effective contact radius of the probe.

The observed invariance in measured photocurrent with probe size indicated that the response was governed instead by another length scale that was independent of probe diameter. It is proposed that the thermalization length $l_0$ dictates the effective electrode area for current normalization, a hemispherical surface of thermalization over which photo-generated carriers were collected at the probe, i.e., A is approximately $2\pi(l_0)^2$, where $l_0$ or about 100 nm was taken as a conservative upper limit for $\hbar\omega$=3.06 eV.

Figure 3A:
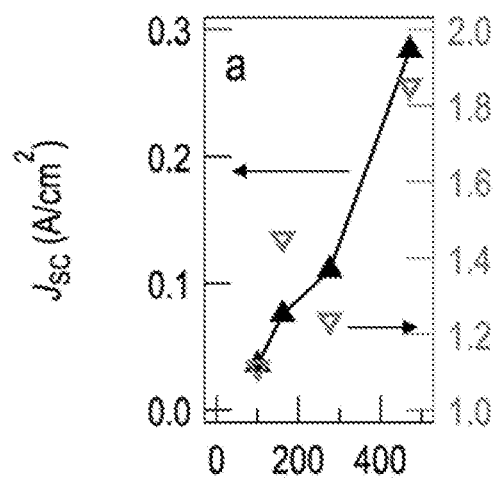
FIG. 3A shows representative quantum and power conversion efficiencies and responsivity in bulk single-domain ferroelectric $BaTiO_3$ at the nanoscale a dependence of short-circuit current density and apparent external quantum efficiency $\eta_{EQE}$ on incident monochromatic ($\lambda$=405 nm) light intensity.
Figure 3B:
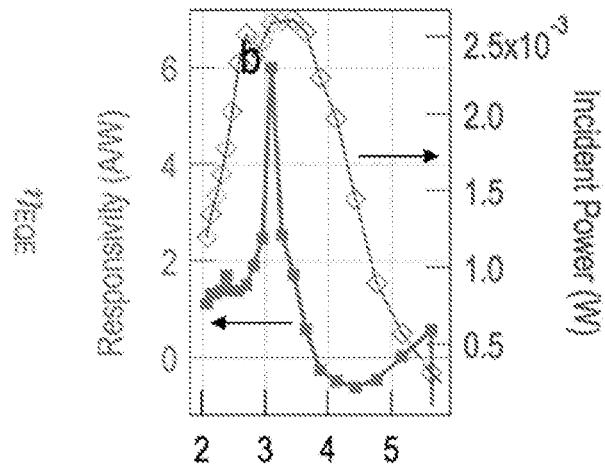
FIG. 3B shows current responsivity as a function of photon energy, along with the incident power.
Figure 3C:
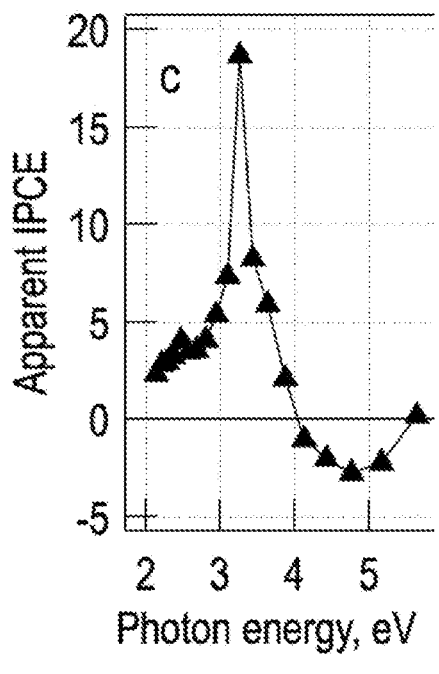
FIG. 3C shows apparent incident photon-to-collected-electron (IPCE) efficiency.
Figure 3D:
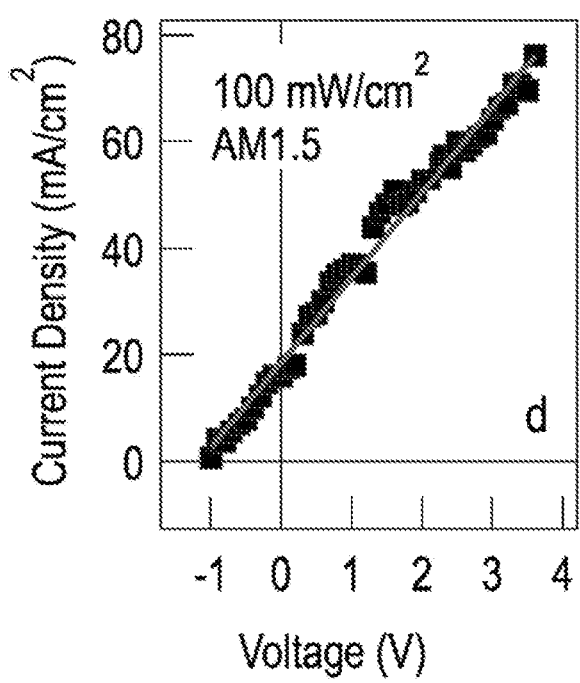
FIG. 3D shows photovoltaic response under 1 sun (100 mW/cm$^2$) AM1.5 G illumination. $\eta_{EQE}$ and IPCE were calculated based on the collective area (surface of thermalization hemisphere) as described in the text.

Shown in FIG. 3A (left axis) are the short-circuit current densities for each intensity at $\hbar\omega$=3.06 eV, obtained from $I_{sc}$ values in FIG. 2B divided by A. Values of the apparent external quantum efficiency $\eta_{EQE}$ (FIG. 3A, right axis), expressed as the ratio of the electron flux density through A to the photon flux density, exceed unity and vary with $I_0$. The BPVE origin of the photoresponse was further confirmed through measuring the variation of the photocurrent with incident photon energy (FIGS. 3B and 3C). The responsivity (FIG. 3B) was seen to be non-zero for photon energies well below $E_g$, likely due to photo-excitation of O vacancy-bound electrons. The responsivity varied with photon energy, its magnitude peaking near the interband transition and changing sign near 3.8 eV, and its spectral shape in agreement with previously published experimental and calculated currents for orthogonal optical and ferroelectric polarizations. The lower values of $\eta_{EQE}$ using the laser source (FIG. 3A) as compared with the collimated monochromatic source (FIG. 3C) were attributed to an overestimate of the intensity in the former due the much higher variation in the beam intensity profile along its radius. Regardless of the source, the apparent incident photon-to-collected-electron (IPCE) efficiency, exceeded unity even for photon energies well below $E_g$, providing additional evidence of the role of non-thermalized carriers in these BPVE devices.

The tip regime of the BPVE in bulk BTO had two key features. First, it was the BPVE in the nanoscaled absorber within $l_0$ where all photo-generated conduction electrons were non-thermalized and contribute to the BPVE. Second, an intense field was concentrated within the thermalization (and photo-generated collection) length $l_0$ of the tip electrode, thereby enabling the quantum efficiency to reach and exceed unity. It explained the difference in quantum efficiency between the nanoscaled capacitor and the tip regime. For the tip-electrode geometry, the relationship η ca. $g_{31}E_{pv}$ was not valid due to the highly nonuniform field. Also, the PV response in conventional devices arises due to optical excitation of carriers across the band gap. In monodomain BaTiO$_3$, the very high $\eta_{EQE}$ from excitation by $\hbar\omega$=3.06. $E_{g.BTO}$ arises from multiple contributions: excitation of oxygen vacancy-bound donor electron yielded hot carriers with kinetic energy of nearly $2E_g$ (ca. 5.7-6.0 eV) in addition to interband excitation, and from a several times higher value of $g_{31}$ in BaTiO$_3$ as compared with BiFeO$_3$.

A proof of the origin of this mechanism involved similar experiments with GaP under planar and tip electrodes. Although GaP is piezoelectric and exhibits the BPVE, GaP is not ferroelectric—that is, it does not possess spontaneous polarization and therefore does not produce the screening field at the tip. The photocurrent measured on a GaP(100) single crystal exhibited the BPVE, but no enhancement in the photoresponse using the tip was found. This validated that the BPVE and screening in the tip regime enabled by ferroelectricity was the operative mechanism.

Unlike in conventional devices that are constrained by the S-Q limit, the ability to collect non-thermalized photogenerated carriers should enable high power conversion efficiency. The J-V response of this nanoscale tip-electroded monodomain bulk BaTiO$_3$ crystal under 1 sun (100 mW/cm$^2$) AM1.5 G illumination is shown in FIG. 3B. With $J_{sc,AM1.5G}$ ca. 19 mA/cm$^2$ and $V_{oc}$ ca. 1.2V, a fill factor of ca.

0.21, the power conversion efficiency (PCE) is 4.8%, the largest reported to date for any single-layer oxide perovskite or simple ternary (ABO$_3$-type) oxide-perovskite. Significantly, the PCE for this BTO hot-carrier BPVE device exceeded by ca. 50% the S-Q limit for a material with a 3.2 eV band gap. Listed in Table I are values of J$_{sc}$ and η$_{EQE}$ for monochromatic illumination of different intensities, and PCE under 1 sun AM 1.5 G illumination, as indicated.

TABLE I

Non-thermalized carrier BPVE device characteristics in the BTO(001) crystal.

| Illumination | Intensity (mW/cm$^2$) | I$_{sc}$ (pA) | J$_{sc}$ (mA/cm$^2$) | η$_{EQE}$ | PCE |
|---|---|---|---|---|---|
| 405 nm | 100 | 22.8 | 36.3 | 1.11 | — |
| " | 160 | 47.6 | 75.8 | 1.45 | — |
| " | 275 | 69.8 | 111.1 | 1.24 | — |
| " | 470 | 178.7 | 284.4 | 1.85 | — |
| AM1.5 G | 100 | 12 | 19.1 | — | 4.8% |

Figure 4:
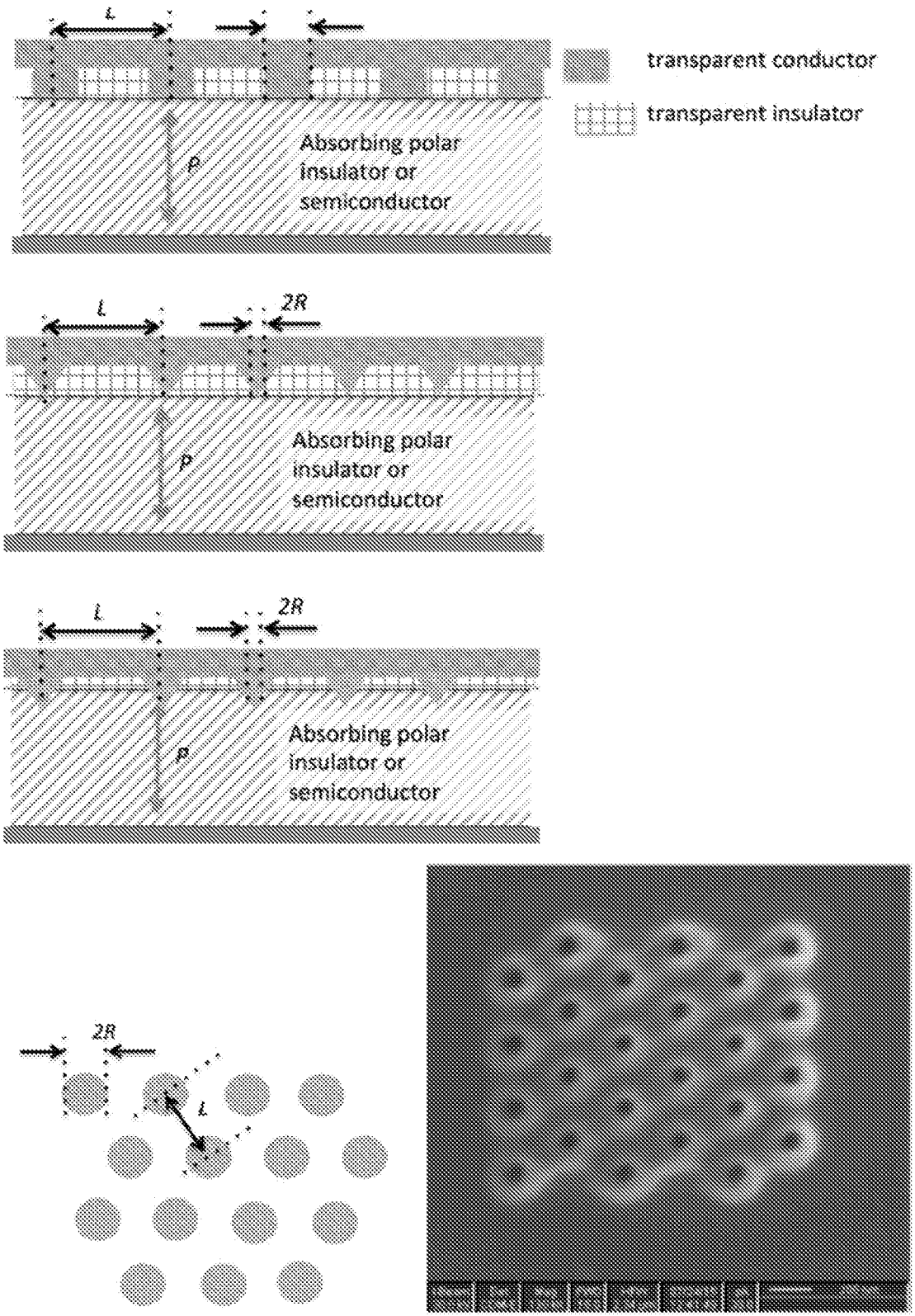
FIG. 4: Top: illustrated examples of nanostructured electrodes as described in the text (side view), with top view shown on the lower left. Shown in the lower right is an electron micrograph image of example set of nano-fabricated columnar pores through Sift, exposing the BaTiO$_3$ produced by focused ion beam milling, prior to filling and connection to produce a sub-electrode array. In this example, R is ca. 50 nm and L is ca. 200 nm. The scale bar in the lower right is 200 nm.

To provide further experimental verification of the large PCE observed in the single-tip device a hexagonal array of 24 indium tin oxide (ITO) electrodes was produced on the poled, single domain-state, bulk crystal BaTiO$_3$ (001) spaced equally over a planar area of ≈1×1 μm2 (FIG. 4 and Methods). Collection of the photocurrent voltage was carried out by probing the 1 μm$^2$ area device under 1 sun, AM 1.5 G illumination. The influence of the low-temperature ITO (see Methods) was included to understand the fraction and frequency distribution of the AM1.5 G light that actually reached the BaTiO3 layer. Physical vapor-deposited ITO at low temperatures (<150° C.) produced films with poor optical transmittance in the near ultraviolet 34. Measurements of the transmissivity for ITO layers deposited with a very similar protocol to those used here showed a strong reduction in transmissivity with decreasing light wavelength, from 60% at 500 nm to 47% at 450 nm, 20% at 375 nm and 5% at 350 nm. Below 350 nm the transmissivity fell even farther, dropping below 1% at 330 nm. This strongly frequency-dependent transmissivity meant that the light fluence reaching the ITO was strongly attenuated and red-shifted.

Next the known wavelength-dependent BaTiO$_3$ absorption coefficient α(λ) and the AM1.5 G irradiance profile I0(λ) of the solar simulator was used to determine the integrated effect of the ITO transmissivity on the light absorption of BaTiO$_3$. Total light absorption was calculated by integrating the product of absorption coefficient and irradiance I(λ):

$$A = \int_{\lambda_1}^{\lambda_2} \alpha(\lambda) I(\lambda) d\lambda \qquad (9)$$

First this expression is adapted to the experimental conditions. Irradiance is that of the solar simulator I$_0$(λ), reduced by the transmissivity of ITO I(λ):

$$A_{expt} = \int_{\lambda_1}^{\lambda_2} \alpha(\lambda) I_0(\lambda) T(\lambda) d\lambda \qquad (10)$$

It was expected that the future deposition of higher-quality transparent electrodes should provide near-unity transmissivity, in an otherwise similar experimental geometry:

$$A_{ideal\ electrode} = \int_{\lambda_1}^{\lambda_2} \alpha(\lambda) I_0(\lambda) d\lambda \qquad (11)$$

Performing these light absorption calculations numerically for known I$_0$, α, and T yielded $$A_{ideal\ electrode}/A_{expt} \approx 30 \qquad (12)$$

Thus, the experimental set-up allowed ⅟30 of the light absorption that full AM1.5 G would provide.

On the basis of this experimental set-up, with reduced photocurrent and photovoltage due to ITO attenuating and red-shifting the light reaching the BaTiO$_3$, the benchmark PCE that would be observed under full AM1.5 G illumination could be deduced. The quantum efficiency observed for the single tip was above unity. Therefore, presuming that photocurrent increased linearly with light absorption is a conservative approximation, such that the photocurrent under the full AM1.5 G would be 30 times the experimentally observed photocurrent. Also, the photovoltage was largely independent of incident fluence, but it was highly sensitive to the frequency distribution of the light. It was assumed that the lower photovoltage was due to this redshift, and that a highly transparent electrode would restore the photovoltage to near 1.1 V. Taking into account these considerations, the array of 24 tips with an idea electrode would yield a photocurrent of 170 pA and a photovoltage of 1.1 V. For the array of 1×1 μm$^2$, this system will give a photocurrent density of 17.0 mA cm$^{-2}$, yielding a PCE of 3.9%. Thus, under full AM1.5 G illumination, 24 closely spaced tips yielded many times the one-tip current. This invalidated the notion that the one-tip result could be explained by collection of carriers over a wide area. If this were true, then the 24 tips would draw from each others' areas, giving no more current than the single tip. The current scaling with the number of tips (maintaining similar current density) confirmed that the assumed value for the thermalization length 10 of 100 nm was reasonable.

High-efficiency conventional solar cells rely on the strong absorption of visible light, the judicious selection of barrier-free electrical contacts, effective separation and the collection of photogenerated carriers within a minimal carrier diffusion length associated with a relatively high carrier lifetime-mobility product and a high ideality factor in pursuit of the S-Q limit. Hot-carrier extraction, multiple exciton generation in semiconductor nanocrystals and photon management, that is, solar concentration using an individual nanowire as an optical cavity, have been proposed and pursued as strategies for overcoming the S-Q limit. By contrast, the BPVE at the nanoscale opens new possibilities using hot-carrier management and carrier multiplication. The transport and collection of photogenerated hot non-equilibrium carriers over l$_0$ in the BPVE was not impeded by the electrode barrier height. Considerable work lies ahead in attaining deeper understanding of the microscopic mechanism(s) and in identifying novel ferroelectric absorbers. Nevertheless the tip electrode-enabled BPVE can now be considered as a promising new paradigm for overcoming conventional power conversion efficiency limits, and optoelectronics in general.

Example 4. Solar Cell Designs

These principles can be applied to nanoscale BPVE to realize a practical, scalable high efficiency BPVE solar cell. The cell consisted of, at minimum a polar insulator absorber material (bulk crystal, polycrystalline or film) that has at least two electrodes. In one example, one electrode was situated on the bottom (top) of the polar absorber, and the second electrode was placed on the top (bottom), whereby it was specially nanostructured according to the discussion below (FIG. 4). As used herein, the term polar absorber may be seen as an equivalent or subset of the term "non-centrosymmetric light absorbing material," used elsewhere. The novelty of the BPVE device includes consideration of a collection of geometric and physical aspects that reflect a fundamentally different set of physical principles that has been used in photovoltaic solar cells to date. In the following, the role of electrode size(s), shape(s), spacing(s), and arrangement(s), and materials selection of the absorber and the electrode, and thickness of the absorber on the nanoscaled BPVE device is discussed.

Example 4.1. Electrodes

As discussed above, in a typical solar cell the current increases with the area of the electrode, whether using a single electrode or multiple electrodes. In the BPVE using a nanoscaled electrode, however, the photogenerated carrier collection was independent of electrode size. Under certain conditions, the generation rate (and current) increased linearly with the number of electrodes N tied together, i.e. the current from the $j^{th}$ electrode $i_{sc,j}$ added with others in series, i.e. $I_{sc}=\beta N i_{sc,j}$, $\beta=1$. In the limit of a small electrode radius (R<<$l_0$) the free path (volume H) $l_0(\lambda)$ (H=$2/3\pi(l_0)^3$) set an upper limit on the collection length (region) of photo-excited hot, quasi-ballistic electrons. For circular electrodes of radius R, electrode center-to-center separation L>2(R+$l_0$) to avoid overlap of hot photogenerated electron collection. If the electrode, however, was comparable to (or larger than) $l_0$ this estimate was only an approximation, and the hemisphere of thermalization is expected to be somewhat larger, assuming that the contact was transparent to the incident photo-generating light. For example, for $\hbar\omega=3.06$ eV, $l_0$ ca. 92 nm and, e.g., assigning R=30 nm, L ca. 250 nm. Since the free path $l_0$ depends linearly on $\hbar\omega$, the ideal distribution of center-to-center separations L(x, y) should incorporate a combination of the absorption in and reflectivity of the material, together with the solar irradiance spectra.

The radius $l_0$ of the hemisphere of thermalization and the local magnitude (and direction) of photovoltaic electric field $E_{pv}$ together dictate the optimal size, spacing and arrangement of nanoscaled electrodes. This, in turn, affected the attainable overall photocurrent density of a solar cell consisting of a planar meso/macro-scopic electrode that connected nanostructured electrodes to a common plane above an insulator, such as illustrated in FIG. 4. For electrodes closely spaced, i.e. L<<$l_0$, overlapping hemispheres of thermalization prevent photogenerated currents from adding in series, |Epv| within H is decreased, and $\beta<1$. For electrodes spaced too far apart, i.e. L ($l_0$, currents add in series ($\beta=1$), but hot electrons photogenerated outside H and outside the region of enhanced photovoltaic electric field and do not reach the contact as hot carriers and thus do not contribute to photocurrent. Further, since $l_0$ is a linear function of photon energy, judicious design of electrodes must reflect a compromise between the offsetting effects of thermalization hemisphere and the intense electric field.

The term "sub-electrodes" is defined as a nanoscaled electrically conductive and spatially distinct region, optically transparent or semi-transparent, which is situated directly on the polar absorber, or extending into the polar absorber, or a combination thereof (FIG. 4). Each sub-electrode was electrically connected to at least one other sub-electrode, but only at a junction above a nonpolar and transparent or semi-transparent insulator layer that is situated on the polar absorber and between the nano scaled electrically conductive regions. Each nonpolar, electrically insulating region had the effect of helping to concentrate the field near and beneath the nanoscaled electrically conductive regions that were in contact with the polar absorber. The nanoscaled electrically conductive regions may be of any cross-sectional shape or size, regular or irregular, e.g. rectangular, triangular, etc. so as to concentrate electric field in the polar absorber and to collect photogenerated current. Connection of multiple sub-electrodes was made by an electrically conductive material, also transparent or semi-transparent. The material may be the same material as the sub-electrode, or a different material. Examples of connectivity include, but are not limited to, regular or irregular arrays of sub-electrodes. Examples of a suitable nonpolar transparent or semi-transparent insulator is $SiO_2$, $SiO_x$, PMMA, $Si_3N_4$, but could also include one-dimensional conductors, e.g., carbon nanotubes or metal nanoparticles.

Example 4.2. Sub-Electrode Arrangement

In principle, the sub-electrode arrangement may take the form of any collection of sub-electrodes, including a set of randomly located sub-electrodes or a regular or irregular array of sub-electrodes. Among possible arrangements of electrodes and assuming no in-plane anisotropy in generation or collection rate and a geometry in which the hemispheres of thermalization are just touching, a hexagonal array of transparent electrodes minimizes the subsurface volume over which photogenerated hot carriers are produced, but do not reach a contact.

Parametric analyses combining electrode size and spacing, aided by electrostatic field simulations, were expected to reveal the optimal design. Combinatorial identification of the combination of smallest value of L for which $\beta=1$ for a given electrode size R (and density of electrodes) represented an example design rule for producing an electrode design that resulted in high photocurrent density and efficiency.

Figure 5:
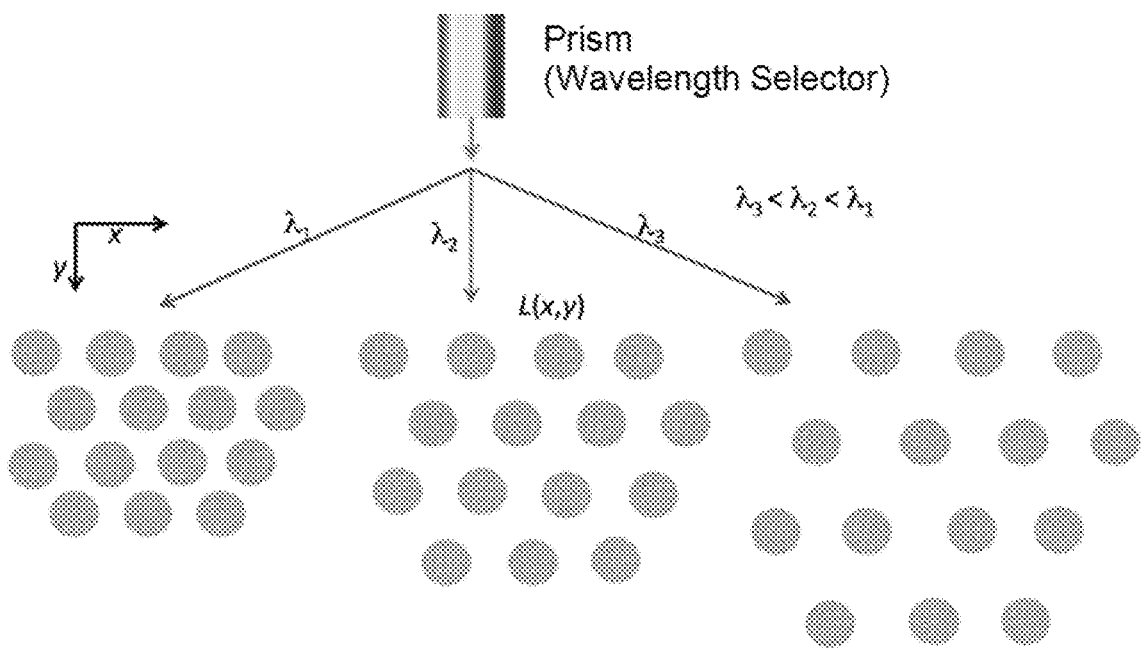
FIG. 5 shows a schematic illustration of modulation of sub-electrode spacings L to accommodate the optical wavelength dependence of $l_0$ and therefore efficiency.
Figure 6:
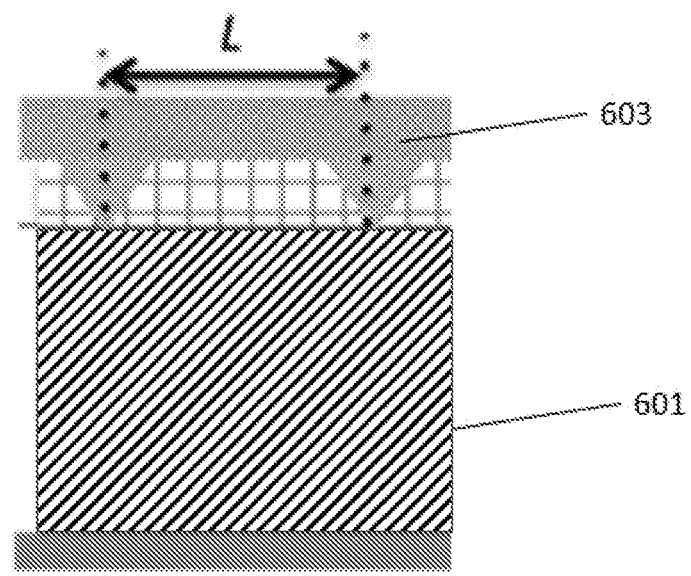
FIG. 6 provides an example embodiment of a photovoltaic cell according to the present disclosure, which embodiment includes a layer of crystalline non-centrosymmetric light-absorbing material having one or more interband transitions (as described elsewhere herein), the layer having first and second surfaces (601), a plurality of electrodes each having a tip disposed in an array upon or penetrating into at least one of the surfaces of the light-absorbing material (603). As shown, each electrode tip is separated from any neighboring tip by a distance L, which distance can be from about 10 nm to about 800 nm.
Figure 7:
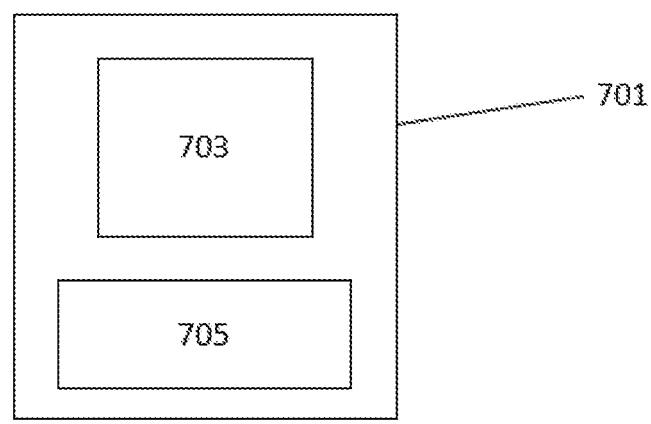
FIG. 7 provides an example electric optical or photosensor device (701). Such a device can include a photovoltaic cell according to FIG. 6 (703), and can also include (705) a fiber optic system, optical scanner, wireless LAN, automatic lighting control, machine vision system, electric eye, optical disk drive, optical memory chip, remote control device, or responsive display device.

The dependence of radius of thermalization hemisphere on photon energy also means that further optimization across different spectral regions should be accounted for, e.g., in a weighted distribution of electrode spacings across the cell. A dispersive optical element, either external to the cell, or integrated as an additional layer on top of the cell, can be used to direct different spectral components of light to different portions of the device, where combinations of parameters R and L are made to vary in accordance with the optical wavelength-dependent $l_0$ (FIG. 5).

Example 4.3. Optically-Absorbing Polar Insulator

Unlike all present photovoltaic solar cells, the present devices rely on an optically-absorbing polar insulator rather than a semiconductor that usually exhibits an appreciable dark electrical conductivity. The PCE of the nano-engineered BPVE solar cell under solar irradiation may be significantly improved by using other non-centrosymmetric (ferroelectric or non-ferroelectric piezoelectric) materials that have lower band gap and/or larger α, particularly in the longer-wavelength visible (or even infrared) portion of the solar spectrum. For example, KBNNO (potassium barium nickel niobate) is a semiconducting ferroelectric exhibiting optical absorption throughout the entire visible spectrum. From Eq. (5), one can calculate the spectrally integrated current density by integrating the differential over an applicable spectral region:

$$\int_{\lambda_1}^{\lambda_2} dJ(\lambda)d\lambda = \int_{\lambda_1}^{\lambda_2} gI_{AM1.5}(\lambda)\alpha(\lambda)d\lambda.$$

Comparison of this integrand for the case of $BaTiO_3$ with that for KBNNO, and assuming the same photovoltage and fill factor, reveals that KBNNO should exhibit a PCE of >30% (FIG. 5). In principle, any semiconducting ferroelectric exhibiting absorption in the visible-wavelength solar spectrum may be a reasonable choice. Among these are $BiFeO_3$, $LaCoO_3$-doped $Bi_4T_{13}O_{12}$, $KBiFe_2O_5$ and cation-ordered $Bi(Fe,Cr)O_3$. This list should not be limited to oxide ferroelectric oxides, but can include non-oxide ferroelectrics, e.g. SbSI, and non-centrosymmetric perovskite lead and/or tin trihalides, e.g. $APbX_3$, $APb_xSn_{1-x}X_3$, where A denotes a methylammonium molecule (MA) or similar polar ion or Cs ion, and X denotes a trihalide ion (i.e. I, Br or Cl) or mixture thereof. In addition, since non-ferroelectric polar materials are also non-centrosymmetric, any non-ferroelectric polar semiconductor material may be used.

Example 5. Conclusions

High-efficiency conventional solar cells rely on strong absorption of visible light, judicious selection of barrier-free electrical contacts, effective separation and collection of photo-generated carriers within a minority carrier diffusion length associated with a relatively high carrier lifetime-mobility product, and high ideality factor in pursuit of the S-Q limit. Photon management, e.g., using a solar concentrator or an individual nanowire as an optical cavity, has been proposed for overcoming the S-Q limit. In contrast, the BPVE in the nanoscale opens new possibilities for efficient hot-carrier management. The transport and collection of photogenerated hot non-equilibrium carriers over $l_0$ in the BPVE is not impeded by electrode barrier height. With emerging single-phase semiconducting ferroelectrics exhibiting solar spectrum-relevant absorption, the nanoscale BPVE may provide a fundamentally new route for practical, high-efficiency photovoltaic solar energy conversion.

As those skilled in the art will appreciate, numerous modifications and variations of the present invention are possible in light of these teachings, and all such are contemplated hereby.

The disclosures of each patent, patent application, and publication cited or described in this document are hereby incorporated herein by reference, each in its entirety, for all purposes.

What is claimed:

1. A photovoltaic cell, comprising:
   a layer of crystalline non-centrosymmetric light-absorbing material, the layer having first and second surfaces; and
   a plurality of electrodes each having a tip disposed in an array upon or penetrating into at least one of the surfaces of the light-absorbing material; wherein
   each electrode tip is separated from any neighboring electrode tip on or beneath the same at least one surface by a distance in a range of from about 10 nm to about 800 nm;
   the light-absorbing material having one or more interband transitions, including a bandgap, $E_c$-$E_v$, in a range of from about 0.1 eV to about 8 eV which, when exposed to at least one wavelength of light in a range of from about 12.4 microns to about 155 nm, is capable of generating a current that consists of electrons at least a fraction of which remain ballistic through collected electrons at the electrodes.

2. The photovoltaic cell of claim 1, wherein the light-absorbing material has one or more interband transitions, including a bandgap, $E_c$-$E_v$, in a range of from about 0.1 eV to about 8 eV which, when exposed to at least one wavelength of light in a range of from about 12.4 microns to about 155 nm, is capable of generating a current of non-equilibrium photo-generated non-thermalized electrons that carry their excess energy to the point of their efficient collection at the electrodes, without the usual barrier height impediment due to blocking or non-Ohmic contacts.

3. The photovoltaic cell of claim 1, wherein the light-absorbing material is an electric insulator material.

4. The photovoltaic cell of claim 1, wherein the light-absorbing material has a bandgap in a range of 0.5 eV to about 5 eV.

5. The photovoltaic cell of claim 1, wherein the light-absorbing material is a piezoelectric material.

6. The photovoltaic cell of claim 1, wherein the light-absorbing material a ferroelectric material.

7. The photovoltaic cell of claim 4, wherein the light-absorbing material exhibits at least one non-zero bulk photovoltaic tensor element.

8. The photovoltaic cell of claim 1, wherein the light-absorbing material is an optionally doped titanate, niobate, or tantalate perovskite-type material.

9. The photovoltaic cell of claim 1, wherein the light-absorbing material is an optionally doped titanate, niobate, or tantalate oxide perovskite-type material.

10. The photovoltaic cell of claim 1, wherein the light-absorbing material is a single crystal.

11. The photovoltaic cell of claim 1, wherein the light-absorbing material is polycrystalline.

12. The photovoltaic cell of claim 1, wherein the layer of crystalline non-centrosymmetric light-absorbing material is at least partially transparent to an incident light in a range of wavelengths of from about 250 nm to about 2500 nm.

13. The photovoltaic cell of claim 1, wherein the first surface is at least partially transmissive and the second surface is least one partially reflective over one or more wavelengths of light in a range of from about 250 nm to about 2500 nm.

14. The photovoltaic cell of claim 1, wherein the array is comprised of two or more sub-arrays, each sub-array tuned to a different wavelength of light, said tuning defined by the spacing of the electrodes within respective sub-array.

15. The photovoltaic cell of claim 1, wherein the electrode spacing is defined as $2 \times l_0$ of at least one wavelength of light in a range of 250 nm to about 2500 nm, where $l_0$ is defined in terms of:

$$l_0 = g e^{-1} \hbar \omega (\xi^{ex})^{-1}$$

for the at least one wavelength of light and the non-centrosymmetric light-absorbing material, where
   g is the bulk photovoltaic scalar component of the non-centrosymmetric light-absorbing material;
   $\hbar \omega$ is the incident photon energy,
   Φ is quantum yield, and
   $\xi^{ex}$ is the photoexcitation asymmetry parameter of the non-centrosymmetric light-absorbing material.

16. The photovoltaic cell of claim 12, wherein the electrode spacing in each sub-array is tuned to $2 \times l_0$ of the wavelength of light to which the sub-array is tuned, where $l_0$ is defined in terms of:

$$l_0 = g e^{-1} \hbar \omega (\xi^{ex})^{-1}$$

for the at least one wavelength of light and the non-centrosymmetric light-absorbing material, where
   g is the bulk photovoltaic scalar component of the non-centrosymmetric light-absorbing material;
   $\hbar \omega$ is the incident photon energy,
   Φ is quantum yield, and
   $\xi^{ex}$ is the photoexcitation asymmetry parameter of the non-centrosymmetric light-absorbing material.

17. The photovoltaic cell of claim 1, wherein the surface contact area of the electrodes on the at least one surface are substantially polygonal or circular.

18. The photovoltaic cell of claim 1, wherein the light absorbing material is a ferroelectric and the plurality of electrodes comprise pin electrodes, the pin electrodes each having a tip having a radius of curvature of R, where R is in a range of from about 10 nm to about 5000 nm.

19. The photovoltaic cell of claim 1, wherein the electrodes are arranged in a hexagonal surface array.

20. The photovoltaic cell of claim 1, wherein the plurality of electrodes are electrically connected to one another.

21. The photovoltaic cell of claim 1, wherein the electrodes comprise a transparent, semi-transparent or non-transparent conducting material or materials, e.g. one or more layer of metal, transparent conducting oxide, conducting polymer.

22. The photovoltaic cell of claim 1, wherein the contacts between the light-absorbing material and electrodes are characterized in terms of an electrostatic barrier height between a [ferroelectric] conduction (valence) band in the light absorbing materials and a Fermi level in the electrode, the electrostatic barrier height being in a range between 0 and approximately 2 eV, so as not to impede carrier collection in accordance with the ballistic and non-thermalized nature of the carriers.

23. The photovoltaic cell of claim 1, wherein the electrodes are nanowires aligned on the at least one surface.

24. The photovoltaic cell of claim 1, further comprising a wavelength-selector (e.g., a prism or wavelength specific reflector) which, during operation, directs specific wavelengths of light to specific areas of the array.

25. A method of generating electricity comprising exposing a photovoltaic cell of claim 1 to a source of incident light and collecting the generated electricity.

26. The method of claim 25, wherein the light is polychromatic over a range of 250 nm to about 2500 nm.

27. The method of claim 25, wherein the light is substantially monochromatic.

28. The method of claim 25, wherein the electrode spacing is tuned to $2 \times l_0$ of at least one wavelength of incident light, where $l_0$ is defined in terms of:

$$l_0 = g e^{-1} \hbar \omega (\xi^{ex})^{-1}$$

for the at least one wavelength of light and the non-centrosymmetric light-absorbing material, where g is the bulk photovoltaic scalar component of the non-centrosymmetric light-absorbing material;

$\hbar\omega$ is the incident photon energy, $\Phi$ is quantum yield, and $\xi^{ex}$ is the photoexcitation asymmetry parameter of the non-centrosymmetric light-absorbing material.

29. The method of claim 28, wherein the incident photon energy, $\hbar\omega$, is greater than the bandgap energy $E_c$-$E_v$.

30. The method of claim 28, wherein the incident photon energy, $\hbar\omega$, is less than the bandgap energy $E_c$-$E_v$.

31. The method of claim 25, wherein the method provides an apparent incident-photon-to collected electron efficiency in a range of from greater than 1 to 20 for at least one incident photon energy based on a surface of thermalization hemisphere, which is itself a linear function of photon energy.

32. The method of claim 25, wherein the method provides an apparent current-to-power responsivity (A/W) in a range of about 0.5 mW to about 8 mW for at least one incident photon energy based on a surface of thermalization hemisphere, which is itself a linear function of photon energy.

33. The method of claim 25, wherein the method provides a power conversion efficiency (response to AM1.5 G or other spectrally broad illumination of intensity 1 sun or higher) exceeding of the Shockley-Queisser limit for the said material, determined by its bandgap, based on a combination or spectrally-weighted radii of thermalization hemisphere.

34. The method of claim 25, wherein the method provides a power conversion efficiency exceeding of the Shockley-Queisser limit for the said material, determined by its bandgap, based on the bulk photovoltaic effect.

35. The method of claim 25, wherein the method provides an apparent responsivity (current per unit power, e.g. A/W) that is (a) all of the same sign, or (b) changes sign depending on photon energy and the incident optical polarization with respect to crystal polar axis.

36. A method of detecting at least one wavelength of incident light comprising exposing a photovoltaic cell of claim 1 to a source of incident light under conditions wherein the photovoltaic cell is operated under short-circuit current conditions.

37. The method of claim 36, wherein the incident light is polychromatic over a range of 250 nm to about 2500 nm.

38. The method of claim 36, wherein the light is substantially monochromatic.

39. An electrical generating system comprising the photovoltaic cell of claim 1.

40. An electric optical or photosensor device comprising the photovoltaic cell of claim 1.

41. The electric optical or photosensor device of claim 40 comprising a fiber optic system, optical scanner, wireless LAN, automatic lighting control, machine vision system, electric eye, optical disk drive, optical memory chip, remote control device, or responsive display device.

* * * * *